(12) United States Patent
Choi et al.

(10) Patent No.: US 12,336,348 B2
(45) Date of Patent: Jun. 17, 2025

(54) DISPLAY DEVICE

(71) Applicant: LG Display Co., Ltd., Seoul (KR)

(72) Inventors: WonJun Choi, Paju-si (KR);
Gwangmin Yeo, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/425,751

(22) Filed: Jan. 29, 2024

(65) Prior Publication Data

US 2024/0290919 A1    Aug. 29, 2024

(30) Foreign Application Priority Data

Feb. 28, 2023    (KR) .................. 10-2023-0026784

(51) Int. Cl.

| | |
|---|---|
| *H10H 20/854* | (2025.01) |
| *G09G 3/20* | (2006.01) |
| *H01L 25/16* | (2023.01) |
| *H10D 86/40* | (2025.01) |
| *H10D 86/60* | (2025.01) |

(52) U.S. Cl.
CPC ............ *H10H 20/854* (2025.01); *G09G 3/20* (2013.01); *H01L 25/167* (2013.01); *H10D 86/441* (2025.01); *H10D 86/60* (2025.01); *G09G 2310/0267* (2013.01)

(58) Field of Classification Search
CPC ..... H01L 33/56; H01L 25/167; H01L 27/124; G09G 3/20; G09G 2310/0267; H10H 20/854; H10D 86/441; H10D 86/60; H10D 64/511; H10D 10/821; H10D 62/054; H10D 30/0295; H10D 84/858; H10D 10/021; G06F 11/3698; H10F 77/337; A23B 11/87
See application file for complete search history.

(56) References Cited

U.S. PATENT DOCUMENTS

| | | | |
|---|---|---|---|
| 10,367,173 B1* | 7/2019 | Wu ...................... | H01L 33/502 |
| 2016/0260928 A1* | 9/2016 | Choi .................. | H10K 59/8052 |
| 2021/0366891 A1* | 11/2021 | Hong .................... | G06F 1/1637 |
| 2023/0005962 A1* | 1/2023 | Lee ......................... | H01L 24/24 |
| 2024/0290760 A1* | 8/2024 | Choi ...................... | H10D 86/60 |

FOREIGN PATENT DOCUMENTS

WO    WO-2021100983 A1 *    5/2021    ....... H01L 21/28017

* cited by examiner

*Primary Examiner* — Grant Sitta

(74) *Attorney, Agent, or Firm* — Morgan, Lewis & Bockius LLP

(57) ABSTRACT

A display device may include a substrate; an active area in which the plurality of sub pixels is disposed; a non-active area which surrounds the active area; a plurality of first pad electrodes disposed in the non-active area on a front surface of the substrate; a plurality of second pad electrodes disposed in the non-active area on a rear surface of the substrate; a plurality of side lines disposed on the front surface, the rear surface, and a side surface of the substrate to electrically connect the plurality of first pad electrodes and the plurality of second pad electrodes; a side insulating layer surrounding the plurality of side lines and including a black material; an encapsulation layer surrounding the front surface, the rear surface, and the side surface of the substrate; and a seal member surrounding a part of the encapsulation layer.

20 Claims, 12 Drawing Sheets

DISPLAY DEVICE

CROSS-REFERENCE TO RELATED APPLICATIONS

This application claims the benefit of and priority to Korean Patent Application No. 10-2023-0026784 filed on Feb. 28, 2023, the entirety of which is incorporated herein by reference for all purposes.

BACKGROUND

1. Technical Field

The present disclosure relates to a display device, and particularly to, for example, without limitation, a display device using a light emitting diode (LED).

2. Description of the Related Art

Display devices may be used for, among others, a computer monitor, a television, or a cellular phone, or the like, and a display device may employ, for example, an organic light emitting display (OLED) device which is a self-emitting device, a liquid crystal display (LCD) device which requires a separate light source, or the like.

An applicable range of the display device is diversified to personal digital assistants as well as monitors of computers and televisions and a display device with a large display area and a reduced volume and weight is being studied.

Further, recently, a display device including a light emitting diode (LED) is attracting attention as a next generation display device. Since the LED is formed of an inorganic material, rather than an organic material, reliability is excellent so that a lifespan thereof is longer than that of the liquid crystal display device or the organic light emitting display device. Further, the LED has a fast lighting speed, excellent luminous efficiency, and a strong impact resistance so that a stability is excellent and an image having a high luminance can be displayed.

The description of the related art should not be assumed to be prior art merely because it is mentioned in or associated with this section. The description of the related art may include information that describes one or more aspects of the subject technology, and the description in this section does not limit the invention.

SUMMARY

One or more aspects of the present disclosure are directed to providing a display device which minimizes moisture permeation from the outside.

One or more other aspects of the present disclosure are directed to providing a display device which minimizes migration caused by wiring lines or electrodes ionized due to the moisture permeation.

One or more other aspects of the present disclosure are directed to providing a display device which minimizes corrosion of the wiring line or the electrode due to the moisture permeation.

Aspects of the present disclosure are not limited to the above-mentioned aspects, and other aspects, which are not mentioned above, can be clearly understood by those skilled in the art from the descriptions herein.

According to one or more aspects of the present disclosure, a display device may include a substrate; an active area in which the plurality of sub pixels is disposed; a non-active area which surrounds the active area; a plurality of first pad electrodes which is disposed in the non-active area on a front surface of the substrate to transmit electrical signals to the plurality of sub pixels; a plurality of second pad electrodes which is disposed in the non-active area on a rear surface of the substrate to be electrically connected to a printed circuit board; a plurality of side lines which is disposed on the front surface, the rear surface, and a side surface of the substrate to electrically connect the plurality of first pad electrodes and the plurality of second pad electrodes; a side insulating layer which surrounds the plurality of side lines and includes a black material; an encapsulation layer which surrounds the front surface, the rear surface, and the side surface of the substrate; and a seal member which surrounds a part of the encapsulation layer. Accordingly, an electrode is ionized by blocking moisture entering from the outside to the inside of the display device to minimize the migration.

According to one or more aspects of the present disclosure, a display device may include a substrate; an active area in which a plurality of sub pixels is disposed; a non-active area which surrounds the active area; a plurality of first pad electrodes which is disposed in the non-active area on a front surface of the substrate to transmit electrical signals to the plurality of sub pixels; a plurality of second pad electrodes which is disposed in the non-active area on a rear surface of the substrate to be electrically connected to an electrical component disposed below the substrate; a plurality of side lines provided at least on a side surface of the substrate to electrically connect the plurality of first pad electrodes and the plurality of second pad electrodes; a side insulating layer which surrounds the plurality of side lines; and an encapsulation layer which surrounds the front surface, the rear surface, and the side surface of the substrate.

Other detailed matters of one or more example embodiments are included in the detailed description and the drawings.

According to one or more aspects of the present disclosure, moisture entering the display device from the outside is blocked using an encapsulation layer.

According to one or more aspects of the present disclosure, ionization to be caused in a conductive component formed of silver (Ag) and migration phenomenon caused by the ionization may be reduced.

According to one or more aspects of the present disclosure, the corrosion of the side line is minimized to improve the reliability of the display device.

The effects according to one or more aspects of the present disclosure are not limited to the foregoing descriptions, and other effects are included in the present specification.

Other aspects, effects, devices, methods, features and advantages will be, or will become, apparent to one with skill in the art upon examination of the drawings and detailed description herein. It is intended that all such aspects, effects, devices, methods, features and advantages be included within this description, be within the scope of the present disclosure, and be protected by the following claims. Nothing in this section should be taken as a limitation on the claims. Further aspects and advantages are discussed below in conjunction with embodiments of the disclosure.

It is to be understood that both the foregoing description and the following description of the present disclosure are examples, and are intended to provide further explanation of the disclosure as claimed.

BRIEF DESCRIPTION OF THE DRAWINGS

The accompanying drawings, which are included to provide a further understanding of the disclosure, are incorporated in and constitute a part of this disclosure, illustrate aspects and embodiments of the disclosure, and together with the description serve to explain principles and examples of the disclosure.

In the drawings.

Figure 1:
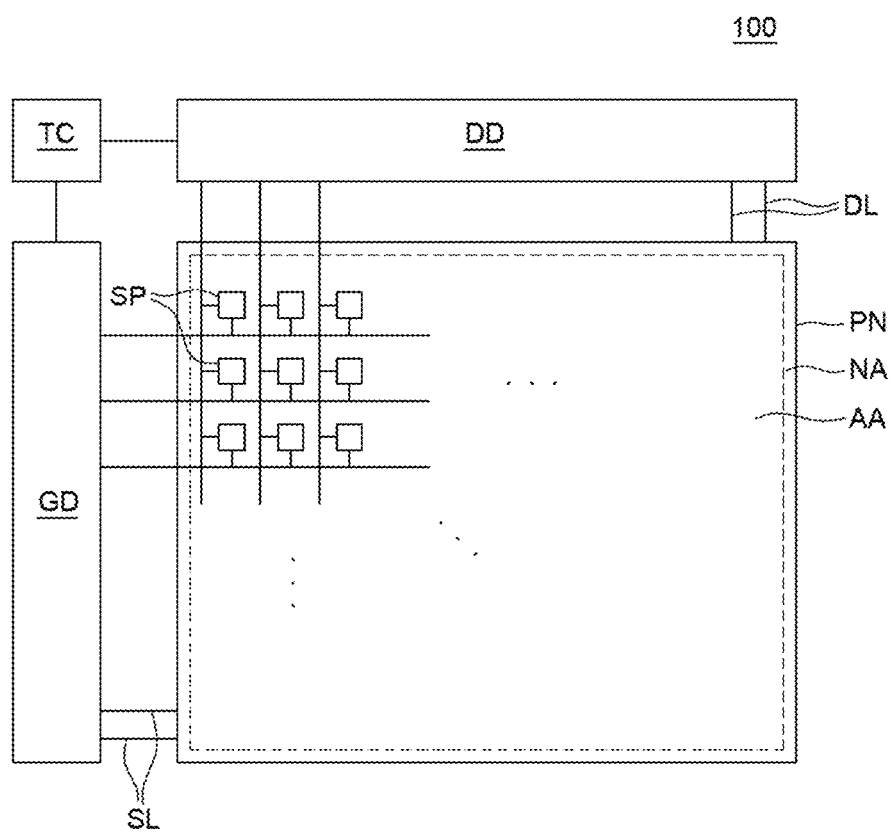
FIG. 1 is a schematic diagram of a display device according to one or more example embodiments of the present disclosure.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and/or convenience.

DETAILED DESCRIPTION

Reference is now made in detail to embodiments of the present disclosure, examples of which may be illustrated in the accompanying drawings. In the following description, when a detailed description of well-known methods, functions, structures or configurations may unnecessarily obscure aspects of the present disclosure, the detailed description thereof may have been omitted for brevity. Further, repetitive descriptions may be omitted for brevity. The progression of processing steps and/or operations described is a non-limiting example.

The sequence of steps and/or operations is not limited to that set forth herein and may be changed to occur in an order that is different from an order described herein, with the exception of steps and/or operations necessarily occurring in a particular order. In one or more examples, two operations in succession may be performed substantially concurrently, or the two operations may be performed in a reverse order or in a different order depending on a function or operation involved.

Unless stated otherwise, like reference numerals may refer to like elements throughout even when they are shown in different drawings. Unless stated otherwise, the same reference numerals may be used to refer to the same or substantially the same elements throughout the specification and the drawings. In one or more aspects, identical elements (or elements with identical names) in different drawings may have the same or substantially the same functions and properties unless stated otherwise. Names of the respective elements used in the following explanations are selected only for convenience and may be thus different from those used in actual products.

Advantages and features of the present disclosure, and implementation methods thereof, are clarified through the embodiments described with reference to the accompanying drawings. The present disclosure may, however, be embodied in different forms and should not be construed as limited to the embodiments set forth herein. Rather, these embodiments are examples and are provided so that this disclosure may be thorough and complete to assist those skilled in the art to understand the inventive concepts without limiting the protected scope of the present disclosure.

Shapes, dimensions (e.g., sizes, lengths, widths, heights, thicknesses, locations, radii, diameters, and areas), proportions, ratios, angles, numbers, the number of elements, and the like disclosed herein, including those illustrated in the drawings, are merely examples, and thus, the present disclosure is not limited to the illustrated details. It is, however, noted that the relative dimensions of the components illustrated in the drawings are part of the present disclosure.

When the term "comprise," "have," "include," "contain," "constitute," "made of," "formed of," "composed of," or the like is used with respect to one or more elements (e.g., layers, films, regions, components, sections, members, parts, regions, areas, portions, steps, operations, and/or the like), one or more other elements may be added unless a term such as "only" or the like is used. The terms used in the present disclosure are merely used in order to describe particular example embodiments, and are not intended to limit the scope of the present disclosure. The terms of a singular form may include plural forms unless the context clearly indicates otherwise. The word "exemplary" is used to mean serving as an example or illustration. Embodiments are example embodiments. Aspects are example aspects. "Embodiments," "examples," "aspects," and the like should not be construed to be preferred or advantageous over other implementations. An embodiment, an example, an example embodiment, an aspect, or the like may refer to one or more embodiments, one or more examples, one or more example embodiments, one or more aspects, or the like, unless stated otherwise. Further, the term "may" encompasses all the meanings of the term "can."

In one or more aspects, unless explicitly stated otherwise, an element, feature, or corresponding information (e.g., a level, range, dimension, size, or the like) is construed to include an error or tolerance range even where no explicit description of such an error or tolerance range is provided. An error or tolerance range may be caused by various factors (e.g., process factors, internal or external impact, noise, or the like). In interpreting a numerical value, the value is interpreted as including an error range unless explicitly stated otherwise.

When a positional relationship between two elements (e.g., layers, films, regions, components, sections, members, parts, regions, areas, portions, and/or the like) are described using any of the terms such as "on," "on a top of," "upon," "on top of," "over," "under," "above," "upper," "below," "lower," "beneath," "near," "close to," "adjacent to," "beside," "next to," "at or on a side of," and/or the like indicating a position or location, one or more other elements may be located between the two elements unless a more limiting term, such as "immediate(ly)," "direct(ly)," or "close(ly)," is used. For example, when an element and another element are described using any of the foregoing terms, this description should be construed as including a case in which the elements contact each other directly as well as a case in which one or more additional elements are disposed or interposed therebetween. Furthermore, the spatially relative terms such as the foregoing terms as well as other terms such as "front," "rear," "back," "left," "right," "top," "bottom," "downward," "upward," "up," "down," "column," "row," "vertical," "horizontal," "diagonal," and the like refer to an arbitrary frame of reference. For example, these terms may be used for an example understanding of a relative relationship between elements, including any correlation as shown in the drawings. However, embodiments of the disclosure are not limited thereby or thereto. The spatially relative terms are to be understood as terms including different orientations of the elements in use or in operation in addition to the orientation depicted in the drawings or described herein. For example, where a lower element or an element positioned under another element is overturned, then the element may be termed as an upper element or an element positioned above another element. Thus, for example, the term "under" or "beneath" may encompass, in meaning, the term "above" or "over." An example term "below" or the like, can include all directions, including directions of "below," "above" and diagonal directions. Likewise, an example term "above," "on" or the like can include all directions, including directions of "above," "on," "below" and diagonal directions.

In describing a temporal relationship, when the temporal order is described as, for example, "after," "subsequent," "next," "before," "preceding," "prior to," or the like, a case that is not consecutive or not sequential may be included and thus one or more other events may occur therebetween, unless a more limiting term, such as "just," "immediate(ly)," or "direct(ly)," is used.

It is understood that, although the terms "first," "second," and the like may be used herein to describe various elements (e.g., layers, films, regions, components, sections, members, parts, regions, areas, portions, steps, operations, and/or the like), these elements should not be limited by these terms, for example, to any particular order, precedence, or number of elements. These terms are used only to distinguish one element from another. For example, a first element may denote a second element, and, similarly, a second element may denote a first element, without departing from the scope of the present disclosure. Furthermore, the first element, the second element, and the like may be arbitrarily named according to the convenience of those skilled in the art without departing from the scope of the present disclosure. For clarity, the functions or structures of these elements (e.g., the first element, the second element, and the like) are not limited by ordinal numbers or the names in front of the elements. Further, a first element may include one or more first elements. Similarly, a second element or the like may include one or more second elements or the like.

In describing elements of the present disclosure, the terms "first," "second," "A," "B," "(a)," "(b)," or the like may be used. These terms are intended to identify the corresponding element(s) from the other element(s), and these are not used to define the essence, basis, order, or number of the elements.

For the expression that an element (e.g., layer, film, region, component, section, member, part, region, area, portion, or the like) is "connected," "coupled," "attached," "adhered," or the like to another element, the element can not only be directly connected, coupled, attached, adhered, or the like to another element, but also be indirectly connected, coupled, attached, adhered, or the like to another element with one or more intervening elements disposed or interposed between the elements, unless otherwise specified.

For the expression that an element (e.g., layer, film, region, component, section, member, part, region, area, portion, or the like) "contacts," "overlaps," or the like with another element, the element can not only directly contact, overlap, or the like with another element, but also indirectly contact, overlap, or the like with another element with one or more intervening elements disposed or interposed between the elements, unless otherwise specified.

The phase that an element (e.g., layer, film, region, component, section, member, part, region, area, portion, or the like) surrounds or is "provided," "disposed," "connected," "coupled," or the like in, on, with or to another element may be understood, for example, as that at least a portion of the element surrounds or is provided, disposed, connected, coupled, or the like in, on, with or to at least a portion of another element. The phrase "through" may be understood, for example, to be at least partially through or entirely through. The phase that an element (e.g., layer, film, region, component, section, member, part, region, area, portion, or the like) "contacts," "overlaps," or the like with another element may be understood, for example, as that at least a portion of the element contacts, overlaps, or the like with a least a portion of another element.

The terms such as a "line" or "direction" should not be interpreted only based on a geometrical relationship in which the respective lines or directions are parallel, perpendicular, diagonal, or slanted with respect to each other, and may be meant as lines or directions having wider directivities within the range within which the components of the present disclosure may operate functionally.

The term "at least one" should be understood as including any and all combinations of one or more of the associated listed items. For example, each of the phrases "at least one of a first item, a second item, or a third item" and "at least one of a first item, a second item, and a third item" may represent (i) a combination of items provided by two or more of the first item, the second item, and the third item or (ii) only one of the first item, the second item, or the third item. Further, at least one of a plurality of elements can represent (i) one element of the plurality of elements, (ii) some elements of the plurality of elements, or (iii) all elements of the plurality of elements. Further, "at least some," "some," "some elements," "a portion," "portions," "at least a portion," "at least portions," "a part," "at least a part," "parts," "at least parts," "one or more," or the like of the plurality of elements can represent (i) one element of the plurality of elements, (ii) a part of the plurality of elements, (iii) parts of the plurality of elements, (iv) multiple elements of the plurality of elements, or (v) all of the plurality of elements. Moreover, at least a portion (or a part) of an element can represent (i) a portion (or a part) of the element, (ii) one or more portions (or parts) of the element, or (iii) the element, or the entirety of the element. A phrase that a plurality of first elements are connected to a plurality of second elements may describe, for example, that at least a part (or one or more first elements) of a plurality of first elements are connected to at least a part (or one or more second elements) of a plurality of second elements.

The expression of a first element, a second elements "and/or" a third element should be understood as one of the first, second and third elements or as any or all combinations of the first, second and third elements. By way of example, A, B and/or C may refer to only A; only B; only C; any of A, B, and C (e.g., A, B, or C); some combination of A, B, and C (e.g., A and B; A and C; or B and C); or all of A, B, and C. Furthermore, an expression "A/B" may be understood as A and/or B. For example, an expression "A/B" may refer to only A; only B; A or B; or A and B.

In one or more aspects, the terms "between" and "among" may be used interchangeably simply for convenience unless stated otherwise. For example, an expression "between a plurality of elements" may be understood as among a plurality of elements. In another example, an expression "among a plurality of elements" may be understood as between a plurality of elements. In one or more examples, the number of elements may be two. In one or more examples, the number of elements may be more than two. Furthermore, when an element (e.g., layer, film, region, component, section, member, part, region, area, portion, or the like) is referred to as being "between" at least two elements, the element may be the only element between the at least two elements, or one or more intervening elements may also be present.

In one or more aspects, the phrases "each other" and "one another" may be used interchangeably simply for convenience unless stated otherwise. For example, an expression "different from each other" may be understood as being different from one another. In another example, an expression "different from one another" may be understood as being different from each other. In one or more examples, the number of elements involved in the foregoing expression may be two. In one or more examples, the number of elements involved in the foregoing expression may be more than two.

In one or more aspects, the phrases "one or more among" and "one or more of" may be used interchangeably simply for convenience unless stated otherwise.

The term "or" means "inclusive or" rather than "exclusive or." That is, unless otherwise stated or clear from the context, the expression that "x uses a or b" means any one of natural inclusive permutations. For example, "a or b" may mean "a," "b," or "a and b." For example, "a, b or c" may mean "a," "b," "c," "a and b," "b and c," "a and c," or "a, b and c."

Features of various embodiments of the present disclosure may be partially or entirely coupled to or combined with each other, may be technically associated with each other, and may be variously operated, linked or driven together in various ways. Embodiments of the present disclosure may be implemented or carried out independently of each other or may be implemented or carried out together in a co-dependent or related relationship. In one or more aspects, the components of each apparatus and device according to various embodiments of the present disclosure are operatively coupled and configured.

Unless otherwise defined, the terms (including technical and scientific terms) used herein have the same meaning as commonly understood by one of ordinary skill in the art to which example embodiments belong. It is further understood that terms, such as those defined in commonly used dictionaries, should be interpreted as having a meaning that is, for example, consistent with their meaning in the context of the relevant art and should not be interpreted in an idealized or overly formal sense unless expressly defined otherwise herein.

The terms used herein have been selected as being general in the related technical field; however, there may be other terms depending on the development and/or change of technology, convention, preference of technicians, and so on. Therefore, the terms used herein should not be understood as limiting technical ideas, but should be understood as examples of the terms for describing example embodiments.

Further, in a specific case, a term may be arbitrarily selected by an applicant, and in this case, the detailed meaning thereof is described herein. Therefore, the terms used herein should be understood based on not only the name of the terms, but also the meaning of the terms and the content hereof.

In the following description, various example embodiments of the present disclosure are described in detail with reference to the accompanying drawings. With respect to reference numerals to elements of each of the drawings, the same elements may be illustrated in other drawings, and like reference numerals may refer to like elements unless stated otherwise. The same or similar elements may be denoted by the same reference numerals even though they are depicted in different drawings. In addition, for convenience of description, a scale, dimension, size, and thickness of each of the elements illustrated in the accompanying drawings may be different from an actual scale, dimension, size, and thickness, and thus, embodiments of the present disclosure are not limited to a scale, dimension, size, and thickness illustrated in the drawings.

Figure 2A:
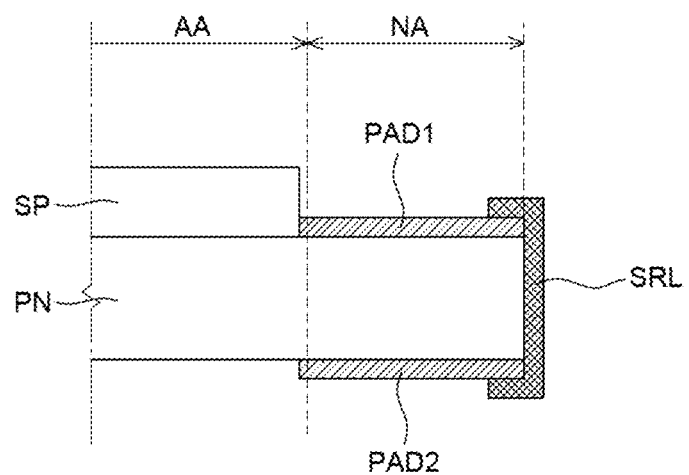
FIG. 2A is a partial cross-sectional view of a portion of a display device according to one or more example embodiments of the present disclosure.
Figure 2B:
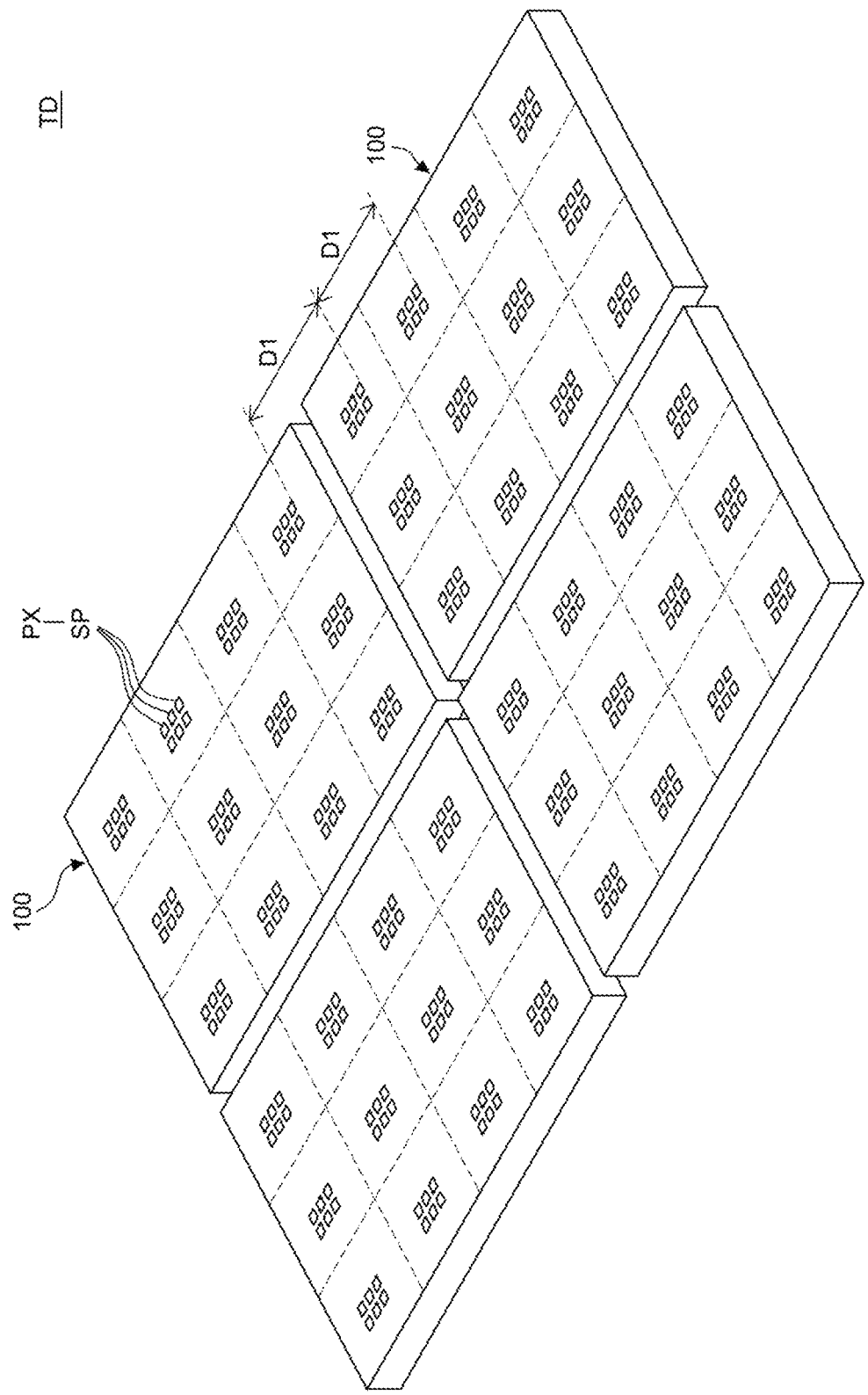
FIG. 2B is a perspective view of a tiling display device according to one or more example embodiments of the present disclosure.

FIG. 1 is a schematic diagram of a display device according to one or more example embodiments of the present disclosure. FIG. 2A is a partial cross-sectional view of a portion of a display device according to one or more example embodiments of the present disclosure. FIG. 2B is a perspective view of a tiling display device according to one or more example embodiments of the present disclosure. In FIG. 1, for the convenience of description, among various components of the display device 100, only a display panel PN, a gate driver GD, a data driver DD, and a timing controller TC are illustrated.

Referring to FIG. 1, the display device 100 includes a display panel PN including a plurality of sub pixels SP, a gate driver GD and a data driver DD which supply various signals to the display panel PN, and a timing controller TC which controls the gate driver GD and the data driver DD.

The gate driver GD supplies a plurality of scan signals to a plurality of scan lines SL in accordance with a plurality of gate control signals supplied from the timing controller TC. Even though in FIG. 1, it is illustrated that one gate driver GD is disposed to be spaced apart from one side of the display panel PN, the number of the gate drivers GD and the placement thereof are not limited thereto.

The data driver DD converts image data input from the timing controller TC into a data voltage using a reference gamma voltage in accordance with a plurality of data control signals supplied from the timing controller TC. The data driver DD may supply the converted data voltage to the plurality of data lines DL.

The timing controller TC aligns image data input from the outside to supply the image data to the data driver DD. The timing controller TC may generate a gate control signal and a data control signal using synchronization signals input from the outside, such as a dot clock signal, a data enable signal, and horizontal/vertical synchronization signals. Further, the timing controller TC supplies the generated gate control signal and data control signal to the gate driver GD and the data driver DD, respectively, to control the gate driver GD and the data driver DD.

The display panel PN is a configuration which displays images to the user and includes the plurality of sub pixels SP. In the display panel PN, the plurality of scan lines SL and the plurality of data lines DL intersect each other and the plurality of sub pixels SP is connected to the scan lines SL and the data lines DL, respectively. In addition, even though it is not illustrated in the drawing, each of the plurality of sub pixels SP may be connected to a high potential power line, a low potential power line, and a reference line.

In the display device 100 or the display panel PN, an active area AA and the non-active area NA surrounding the active area AA may be defined.

The active area AA is an area in which images are displayed in the display device 100. In the active area AA, a plurality of sub pixels SP which configures a plurality of pixels PX and a circuit for driving the plurality of sub pixels SP may be disposed. The plurality of sub pixels SP is a minimum unit which configures the active area AA and n sub pixels SP form one pixel, where n is a whole number greater than 0. In each of the plurality of sub pixels SP, a light emitting diode and a thin film transistor for driving the light emitting diode may be disposed. The plurality of light emitting diodes may be defined in different manners depending on the type of the display panel PN. For example, when the display panel PN is an inorganic light emitting display panel, the light emitting diode may be a light emitting diode (LED) or a micro light emitting diode (LED).

In the active area AA, a plurality of wiring lines which transmits various signals to the plurality of sub pixels SP is disposed. For example, the plurality of wiring lines includes a plurality of data lines DL each of which may supply a data voltage to a corresponding one of the plurality of sub pixels SP and a plurality of scan lines SL each of which may supply a scan signal to a corresponding one of the plurality of sub pixels SP. The plurality of scan lines SL extends in one direction in the active area AA to be connected to the plurality of sub pixels SP and the plurality of data lines DL extends in a direction different from the one direction in the active area AA to be connected to the plurality of sub pixels SP. In addition, in the active area AA, a low potential power line and a high potential power line may be further disposed, but are not limited thereto.

The non-active area NA is an area where images are not displayed so that the non-active area NA may be defined as an area extending from the active area AA. In the non-active area NA, a link line which transmits a signal to the sub pixel SP of the active area AA, a pad electrode, or a driving integrated circuit (IC), such as a gate driver IC or a data driver IC, may be disposed.

However, the non-active area NA may be located on a rear surface of the display panel PN, that is, a surface on which the sub pixels SP are not disposed or may be omitted, and is not limited as illustrated in the drawing.

In the meantime, a driver, such as a gate driver GD, a data driver DD, and a timing controller TC, may be connected to the display panel PN in various ways. For example, the gate driver GD may be mounted in the non-active area NA in a gate in panel (GIP) manner or mounted between the plurality of sub pixels SP in the active area AA in a gate in active area (GIA) manner. For example, the data driver DD and the timing controller TC are formed in separate flexible film and printed circuit board PCB. The data driver DD and the timing controller TC are electrically connected to the display panel PN by bonding the flexible film and the printed circuit board PCB to the pad electrode formed in the non-active area NA of the display panel PN.

If the gate driver GD is mounted in the GIP manner and the data driver DD and the timing controller TC transmit a signal to the display panel PN through a pad electrode of the non-active area NA, an area of the non-active area NA for disposing the gate driver GD and the pad electrode is necessary more than a predetermined level. Accordingly, a bezel is increased.

In contrast, the gate driver GD is mounted in the active area AA in the GIA manner and a side line which connects the signal line on the front surface of the display panel PN to the pad electrode on a rear surface of the display panel PN is formed to bond the flexible film and the printed circuit board onto a rear surface of the display panel PN. At this time, the non-active area NA may be minimized on the front surface of the display panel PN. That is, when the gate driver GD, the data driver DD, and the timing controller TC are connected to the display panel PN as described above, a zero bezel with substantially no bezel may be implemented.

Specifically, referring to FIGS. 2A and 2B, in the non-active area NA of the display panel PN, a plurality of pad electrodes PAD1 and PAD2 for transmitting various signals to the plurality of sub pixels SP is disposed. For example, in the non-active area NA on the front surface of the display panel PN, a plurality of first pad electrodes PAD1 which transmits signals to the plurality of sub pixels SP is disposed. In the non-active area NA on the rear surface of the display panel PN, a second pad electrode PAD2 which is electrically connected to a driving component, such as a flexible film and the printed circuit board, is disposed. That is, on the front surface of the display panel PN on which images are displayed, only a pad area of the non-active area NA in which the first pad electrode PAD1 is disposed may be formed at a minimum.

In this case, even though it is not illustrated in the drawing, various signal lines connected to the plurality of sub pixels SP, for example, a scan line SL or a data line DL extends from the active area AA to the non-active area NA to be electrically connected to the first pad electrode PAD1.

Further, the side line SRL is disposed along a side surface of the display panel PN. The side line SRL may electrically connect a first pad electrode PAD1 on the front surface of the display panel PN and a second pad electrode PAD2 on the rear surface of the display panel PN. Therefore, a signal from a driving component on the rear surface of the display panel PN may be transmitted to the plurality of sub pixels SP through the second pad electrode PAD2, the side line SRL, and the first pad electrode PAD1. Accordingly, a signal transmitting path from the front surface of the display panel PN to the side surface and the rear surface is formed to minimize an area of the non-active area NA on the front surface of the display panel PN.

Further, referring to FIG. 2B, a tiling display device TD having a large screen size may be implemented by connecting a plurality of display devices 100. At this time, as illustrated in FIG. 2A, when the tiling display device TD is implemented using a display device 100 with a minimized bezel, a seam area in which an image between the display devices TD is not displayed is minimized so that a display quality may be improved.

For example, the plurality of sub pixels SP forms one pixel PX and a distance D1 between an outermost pixel PX of one display device 100 and an outermost pixel PX of another display device 100 adjacent to one display device may be implemented to be equal to a distance D1 between pixels PX in one display device 100. Accordingly, a distance D1 between pixels PX between the display devices 100 is constantly configured to minimize the seam area.

However, FIGS. 2A and 2B are illustrative so that the display device according to one or more example embodiments of the present disclosure may be a general display device with a bezel, but is not limited thereto.

Figure 3A:
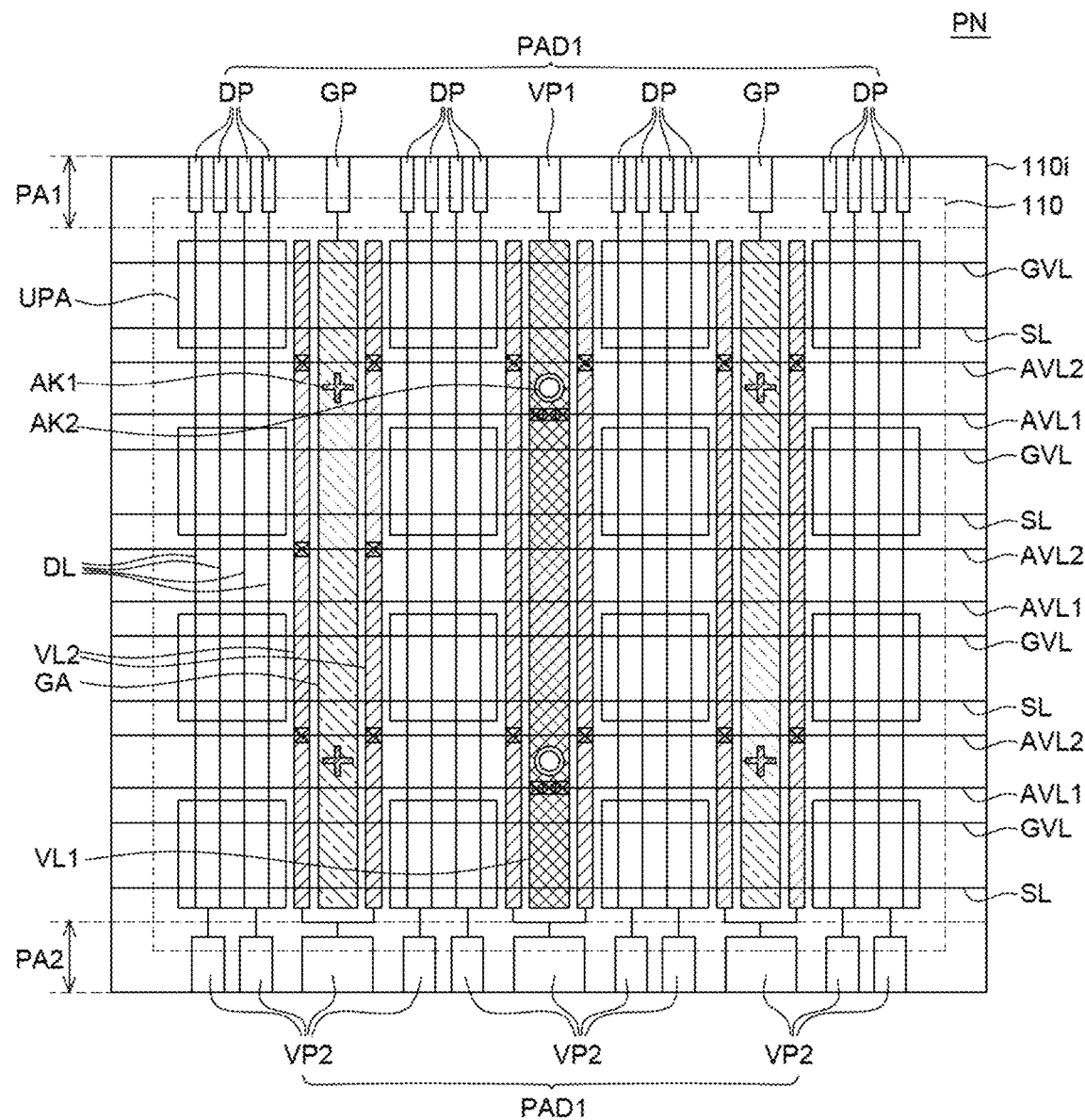
FIG. 3A is a plan view of a display panel before grinding of a display device according to one or more example embodiments of the present disclosure.
Figure 3B:
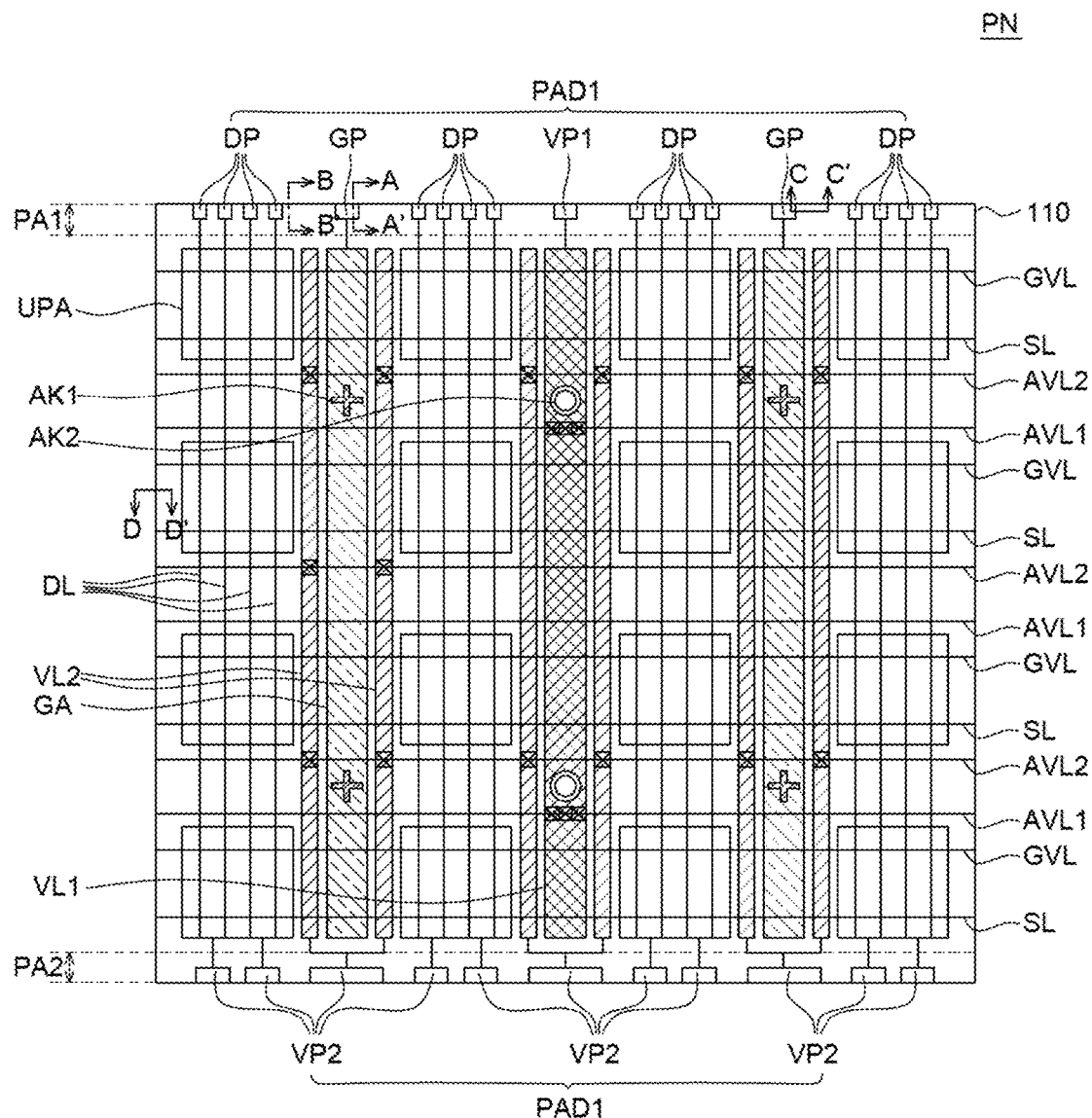
FIG. 3B is a plan view of a display panel after grinding of a display device according to one or more example embodiments of the present disclosure.
Figure 4A:
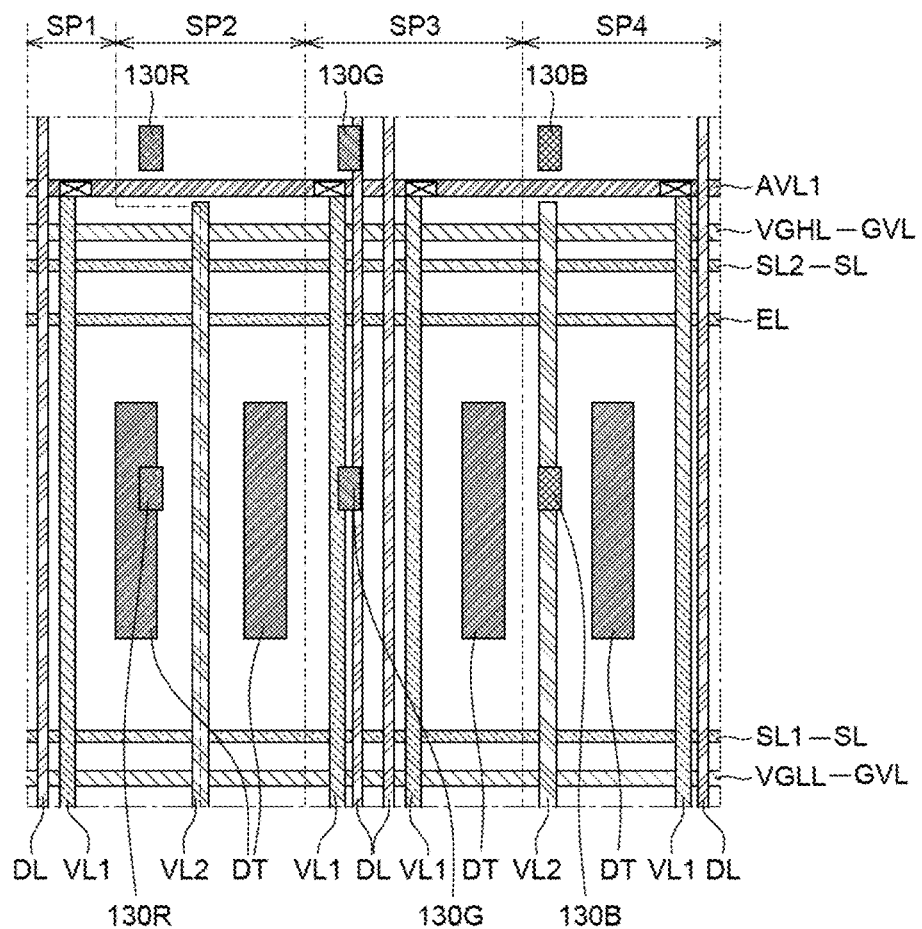
FIGS. 4A and 4B are plan views illustrating a pixel area of a display device according to one or more example embodiments of the present disclosure.
Figure 4B:
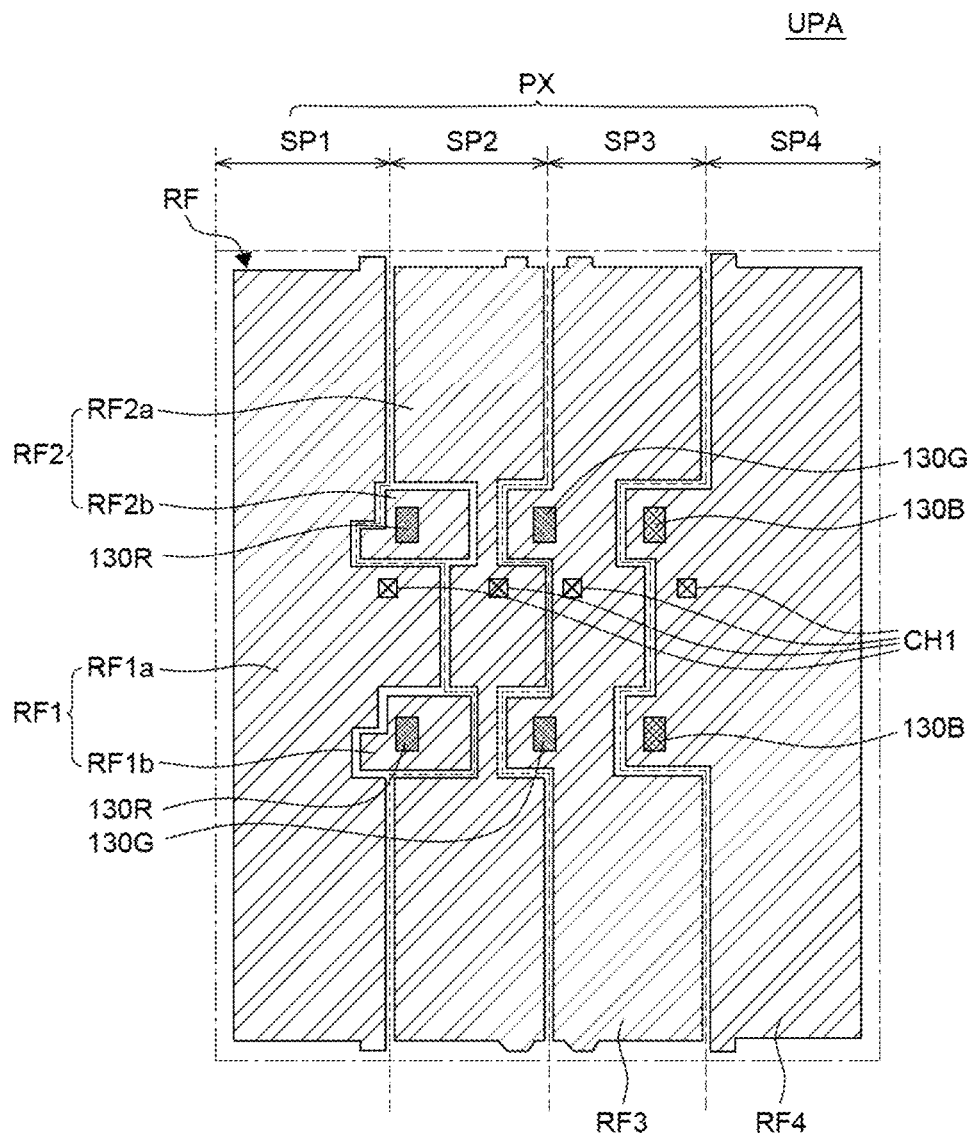
Figure 5:
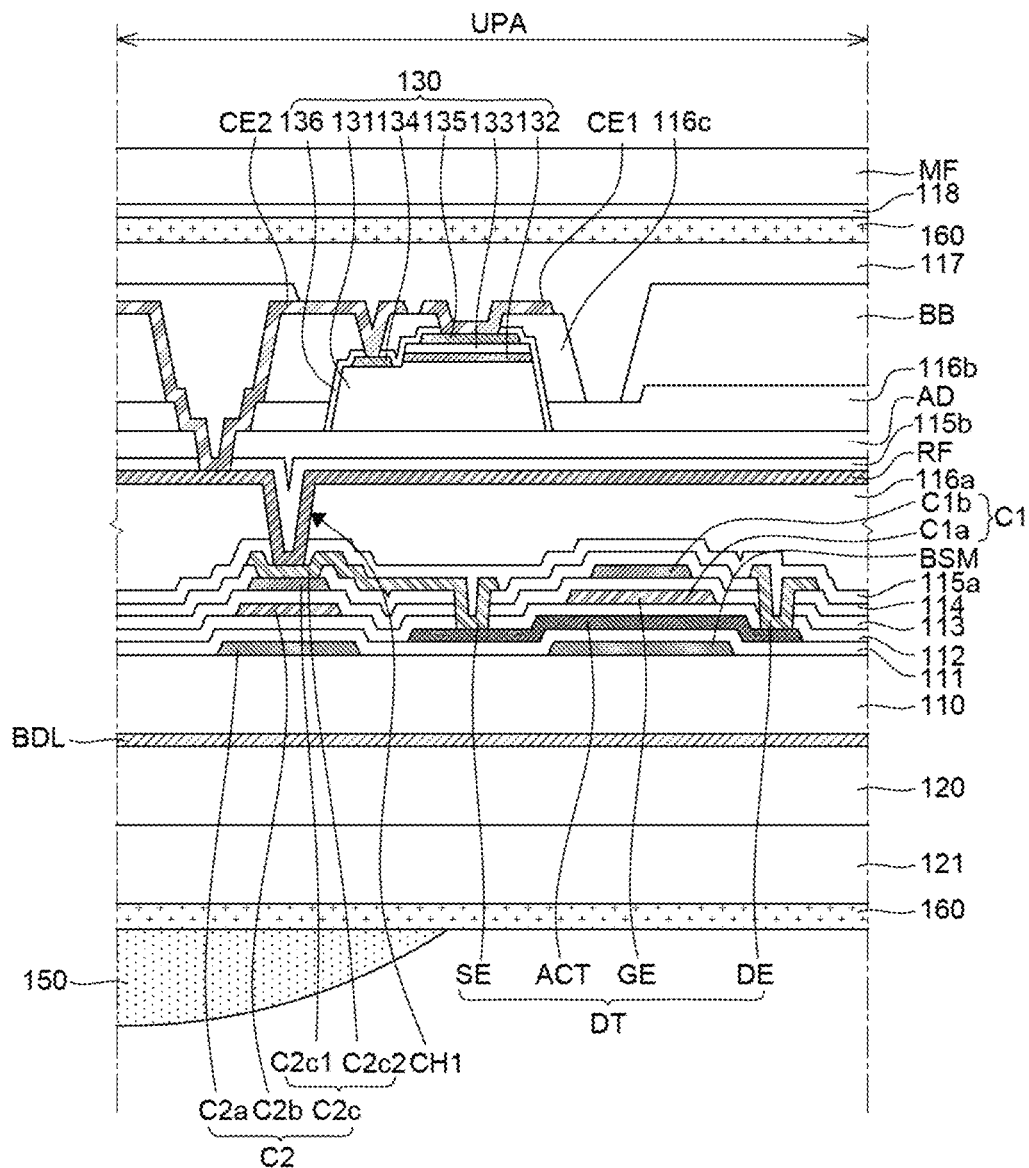
FIG. 5 is a cross-sectional view of a pixel area of a display device according to one or more example embodiments of the present disclosure.

FIG. 3A is a plan view of a display panel before grinding of a display device according to one or more example embodiments of the present disclosure. FIG. 3B is a plan view of a display panel after grinding of a display device according to one or more example embodiments of the present disclosure. FIGS. 4A and 4B are plan views illustrating a pixel area of a display device according to one or more example embodiments of the present disclosure. FIG. 5 is a cross-sectional view of a pixel area of a display device according to one or more example embodiments of the present disclosure. In FIG. 4A, only the plurality of light emitting diodes 130R, 130G, and 130B, a driving transistor DT of the pixel circuit, and a plurality of wiring lines are illustrated and in FIG. 4B, only a plurality of reflection plates RF and a plurality of light emitting diodes 130R, 130G, and 130B, are illustrated. In one or more aspects, the elements and notations illustrated in FIG. 4A but not shown in FIG. 4B may be deemed to be present in FIG. 4B, and the elements and notations illustrated in FIG. 4B but not shown in FIG. 4A may be deemed to be present in FIG. 4A.

First, referring to FIGS. 3A to 5, the display panel PN includes a first substrate 110. The first substrate 110 is a substrate which supports components disposed above the display device 100 and may be an insulating substrate. A plurality of pixels PX is formed on the first substrate 110 to display images. For example, the first substrate 110 may be formed of glass or resin. Further, the first substrate 110 may include polymer or plastic. In some example embodiments, the first substrate 110 may be formed of a plastic material having flexibility.

Referring to FIGS. 3A and 3B, in the first substrate 110, a plurality of pixel areas UPA, a plurality of gate driving areas GA, and a plurality of pad areas are disposed. Among them, the plurality of pixel areas UPA and the plurality of gate driving areas GA may be included in the active area AA of the display panel PN.

First, the plurality of pixel areas UPA is areas in which the plurality of pixels PX is disposed. The plurality of pixel areas UPA may be disposed by forming a plurality of rows and a plurality of columns. Each of the plurality of pixels PX disposed in the plurality of pixel areas UPA includes a plurality of sub pixels SP. Each of the plurality of sub pixels SP includes a light emitting diode 130 and a pixel circuit to independently emit light. A light emitting diode 130 shown in FIG. 5 may represent a light emitting diode 130R, a light emitting diode 130G, and/or a light emitting diode 130B.

The plurality of gate driving areas GA is areas where gate drivers GD are disposed. The gate driver GD may be mounted in the active area AA in a gate in active area (GIA) manner. For example, the gate driving area GA may be formed along a row direction and/or column direction between the plurality of pixel areas UPA. The gate driver GD formed in the gate driving area GA may supply the scan signal to the plurality of scan lines SL.

The gate driver GD disposed in the gate driving area GA may include a circuit for outputting a scan signal. At this time, the gate driver may include a plurality of transistors and/or capacitors as an example. Here, active layers of the plurality of transistors may be formed of a semiconductor material, such as an oxide semiconductor, amorphous silicon, or polysilicon, but are not limited thereto. At this time, the active layers of the plurality of transistors may be formed of the same material or different materials from each other.

Further, the active layers of the plurality of transistors of the gate driver may be formed of the same material as active layers of various transistors of the pixel circuit or formed of different materials from each other.

The plurality of pad areas is areas in which a plurality of first pad electrodes PAD1 is disposed. The plurality of first pad electrodes PAD1 may transmit various signals to various wiring lines extending in a column direction in the active area AA. For example, the plurality of first pad electrodes PAD1 includes a data pad DP, a gate pad GP, a high potential power pad VP1, and a low potential power pad VP2. The data pad DP transmits a data voltage to the data line DL and the gate pad GP transmits a clock signal, a start signal, a gate low voltage, and a gate high voltage for driving the gate driver GD to the gate driver GD. The high potential power pad VP1 transmits a high potential power voltage to the high potential power line VL1, and the low potential power pad VP2 transmits a low potential power voltage to the low potential power line VL2.

The plurality of pad areas includes a first pad area PA1 located at an upper edge of the display panel PN and a second pad area PA2 of the display panel PN. At this time, in the first pad area PA1 and the second pad area PA2, different types of first pad electrodes PAD1 may be disposed. For example, in the first pad area PA1, among the plurality of first pad electrodes PAD1, the data pad DP, the gate pad GP, and the high potential power pad VP1 are disposed and in the second pad area PA2, the low potential power pad VP2 may be disposed.

At this time, the plurality of first pad electrodes PAD1 may be formed to have different sizes. For example, the plurality of data pads DP which is connected to the plurality of data lines DL one to one may have a smaller width and the high potential power pad VP1, the low potential power pad VP2, and the gate pad GP may have a larger width. However, widths of the data pad DP, the gate pad GP, the high potential power pad VP1, and the low potential power pad VP2 illustrated in FIGS. 3A and 3B are illustrative so that the first pad electrode PAD1 may be configured in various sizes, but is not limited thereto.

In the meantime, in order to reduce the bezel of the display panel PN, an edge of the display panel PN may be cut to be removed. For example, as illustrated in FIG. 3A, the plurality of pixels PX, the plurality of wiring lines, and the plurality of first pad electrodes PAD1 are formed on an initial first substrate 110*i*. As illustrated in FIG. 3B, an edge part of the initial first substrate 110*i* is ground to reduce the bezel area. During the grinding process, a part of the initial first substrate 110*i* is removed to form a first substrate 110 with a smaller size. At this time, parts of the plurality of first pad electrodes PAD1 and wiring lines disposed at the edge of the first substrate 110 may be removed. Accordingly, only a part of the plurality of first pad electrodes PAD1 may remain on the first substrate 110.

Next, the plurality of data lines DL which extends in a column direction from the plurality of first pad electrodes PAD1 is disposed on the first substrate 110 of the display panel PN. The plurality of data lines DL may extend from the plurality of data pads DP of the first pad area PA1 toward the plurality of pixel areas UPA. The plurality of data lines DL extends in a column direction and may be disposed to overlap the plurality of pixel areas UPA. Therefore, each of the plurality of data lines DL may transmit the data voltage to the pixel circuit of a corresponding one of the plurality of sub pixels SP.

The plurality of high potential power lines VL1 extending in the column direction is disposed on the first substrate 110 of the display panel PN. Some of the plurality of high potential power lines VL1 extends from the high potential power pad VP1 of the first pad area PA1 to the plurality of pixel areas UPA to transmit the high potential power voltage to the light emitting diodes 130 of the plurality of sub pixels SP. Further, the others of the plurality of high potential power lines VL1 are electrically connected to the other high potential power line VL1 by means of an auxiliary high potential power line AVL1 to be described below. In FIGS. 3A and 3B, for the convenience of description, even though it is illustrated that one high potential power line VL1 and one high potential power pad VP1 are disposed, a plurality of high potential power lines VL1 and high potential power pads VP1 may be disposed.

The plurality of low potential power lines VL2 extending in the column direction is disposed on the first substrate 110 of the display panel PN. At least some of the plurality of low potential power lines VL2 extends from the low potential power pad VP2 of the second pad area PA2 to the plurality of pixel areas UPA, and each of such low potential power lines VL2 may transmit the low potential power voltage to the pixel circuit of a corresponding one of the plurality of sub pixels SP. Further, the others of the plurality of low potential power lines VL2 may be electrically connected to the other low potential power line VL2 by means of an auxiliary low potential power line AVL2 to be described below.

The plurality of scan lines SL extending in the row direction is disposed on the first substrate 110 of the display panel PN. The plurality of scan lines SL extends in the row direction and may be disposed across the plurality of pixel areas UPA and the plurality of gate driving areas GA. The plurality of scan lines SL may transmit the scan signals from the gate driver GD to the pixel circuits of the plurality of sub pixels SP.

A plurality of auxiliary high potential power lines AVL1 extending in the row direction is disposed on the first substrate 110 of the display panel PN. The plurality of auxiliary high potential power lines AVL1 may be disposed in an area(s) between the plurality of pixel areas UPA. The plurality of auxiliary high potential power lines AVL1 extending in the row direction is electrically connected to the plurality of high potential power lines VL1 extending in the column direction through contact holes and forms a mesh structure. Therefore, the plurality of auxiliary high potential power lines AVL1 and the plurality of high potential power lines VL1 are configured to form a mesh structure to minimize voltage drop and voltage deviation.

A plurality of auxiliary low potential power lines AVL2 extending in the row direction is disposed on the first substrate 110 of the display panel PN. The plurality of auxiliary low potential power lines AVL2 may be disposed in an area(s) between the plurality of pixel areas UPA. The plurality of auxiliary low potential power lines AVL2 extending in the row direction is electrically connected to the plurality of low potential power lines VL2 extending in the column direction through contact holes to form a mesh structure. Therefore, the plurality of auxiliary low potential power lines AVL2 and the plurality of low potential power lines VL2 are configured to form a mesh structure to reduce a resistance of the wiring line and minimize voltage deviation.

Referring to FIGS. 3A to 4A, the plurality of gate driving lines GVL extending in the row direction and the column direction is disposed on the first substrate 110 of the display panel PN. Some of the plurality of gate driving lines GVL extends from the gate pad GP of the first pad area PA1 to the gate driving area GA to transmit a signal(s) to the gate driver GD. The others of the plurality of gate driving lines GVL extend in the row direction and transmit the signal(s) to the gate driver GD of the plurality of gate driving areas GA. Therefore, various signals are transmitted from the gate driving line GVL to the gate driver GD to drive the gate driver GD.

The plurality of gate driving lines GVL may include wiring lines which transmit a clock signal, a start signal, a gate high voltage, and a gate low voltage to the gate driver GD. Therefore, various signals are transmitted from the gate driving line GVL to the gate driver GD to drive the gate driver GD.

For example, referring to FIG. 4A, the plurality of gate driving lines GVL may include a gate power line which transmits a power voltage to the gate driver GD of the gate driving area GA. The plurality of gate power lines includes a first gate power line VGHL which transmits a gate high voltage to the gate driver GD and a second gate power line VGLL which transmits a gate low voltage to the gate driver GD.

A plurality of alignment keys AK1 and AK2 is disposed in an area between the plurality of pixel areas UPA in the display panel, as illustrated in FIGS. 3A and 3B. The plurality of alignment keys is used for alignment during the manufacturing process of the display panel PN. The plurality of alignment keys includes a first alignment key and a second alignment key.

The first alignment key AK1 may be disposed in the gate driving area GA between the plurality of pixel areas UPA. The first alignment key may be used to inspect an alignment position of the plurality of light emitting diodes 130. For example, the first alignment key may have a cross shape, but is not limited thereto.

The second alignment key AK2 may be disposed to overlap the high potential power line VL1 between the plurality of pixel areas UPA. In the high potential power line VL1, a hole overlapping the second alignment key is formed to divide the second alignment key and the high potential power line VL1. The second alignment key may be used to align the display panel PN and a donor. The display panel PN and the donor are aligned using the second alignment key and the plurality of light emitting diodes 130 of the donor may be transferred onto the display panel PN. For example, the second alignment key may have a circular ring shape, but is not limited thereto.

Hereinafter, the plurality of sub pixels SP of the pixel area UPA is described in more detail with reference to FIGS. 4A to 5.

Referring to FIGS. 4A and 4B, in one pixel area UPA, a plurality of sub pixels SP which forms one pixel PX is disposed. For example, the plurality of sub pixels SP may include a first sub pixel SP1, a second sub pixel SP2, a third sub pixel SP3, and a fourth sub pixel SP which emit different color light. For example, the first sub pixel SP1 and the second sub pixel SP2 are red sub pixels SP, the third sub pixel SP3 is a green sub pixel SP, and the fourth sub pixel SP may be a blue sub pixel SP, but the present disclosure is not limited thereto.

Referring to FIG. 4A, as described above, a plurality of wiring lines which supplies various signals to the plurality of sub pixels SP is disposed in the plurality of pixel areas UPA of the first substrate 110. For example, the plurality of data lines DL, the plurality of high potential power lines VL1, and the plurality of low potential power lines VL2 extending in the column direction may be disposed on the first substrate 110. For example, the plurality of emission control signal lines EL, the plurality of auxiliary high potential power lines AVL1, the plurality of auxiliary low potential power lines AVL2, the plurality of first scan lines SL1, and the plurality of second scan lines SL2 extending in the row direction may be disposed on the first substrate 110. Further, the high potential power line VL1 extending in the column direction may be electrically connected to the auxiliary high potential power line AVL1 extending in the row direction through a contact hole. At this time, the emission control signal line EL transmits an emission control signal to the pixel circuits of the plurality of sub pixels SP to control emission timings of the plurality of sub pixels SP.

Further, some gate driving lines GVL which transmit signals to the plurality of gate drivers GD disposed to be spaced apart from each other with the pixel area UPA therebetween may be disposed across the pixel area UPA while extending in the row direction. For example, a first gate power line VGHL which supplies a gate high voltage to the gate driver GD and a second gate power line VGLL which supplies a gate low voltage may be disposed across the pixel area UPA.

In the meantime, even though it is illustrated that the plurality of scan lines SL includes a first scan line SL1 and a second scan line SL2, the configuration of the plurality of scan lines SL may vary depending on the pixel circuit configuration of the sub pixel SP, but is not limited thereto.

The pixel circuit for driving the light emitting diode 130 is disposed in each of the plurality of sub pixels SP on the first substrate 110. The pixel circuit may include a plurality of thin film transistors and a plurality of capacitors. In FIGS. 4A and 5, for the convenience of description, only a driving transistor DT, a first capacitor C1, and a second capacitor C2, among configurations of the pixel circuit are illustrated. However, the pixel circuit may further include a switching transistor, a sensing transistor, and an emission control transistor, but is not limited thereto.

First, a light shielding layer BSM is disposed on the first substrate 110. The light shielding layer BSM blocks light which is incident to an active layer ACT of the plurality of transistors to minimize a leakage current. For example, the light shielding layer BSM is disposed below the active layer ACT of the driving transistor DT to block light incident onto the active layer ACT. If light is irradiated onto the active layer ACT, leakage current is generated, which deteriorates the reliability of the transistor. Accordingly, the light shielding layer BSM which blocks the light is disposed on the first substrate 110 to improve the reliability of the driving transistor DT. The light shielding layer BSM may be configured by an opaque conductive material such as copper (Cu), aluminum (Al), molybdenum (Mo), nickel (Ni), titanium (Ti), chrome (Cr), or an alloy thereof, but is not limited thereto.

A buffer layer 111 is disposed on the light shielding layer BSM. The buffer layer 111 may reduce permeation of moisture or impurities through the first substrate 110. The buffer layer 111 may be configured by a single layer or a double layer of silicon oxide SiOx or silicon nitride SiNx as an example, but is not limited thereto. However, the buffer layer 111 may be omitted depending on a type of the first substrate 110 or a type of the thin film transistor, but is not limited thereto.

A driving transistor DT including an active layer ACT, a gate electrode GE, a source electrode SE, and a drain electrode DE is disposed on the buffer layer 111.

In the meantime, even though it is not illustrated in FIG. 5, an additional buffer layer may be disposed between the first substrate 110 and the light shielding layer BSM. The additional buffer layer may be configured by a single layer or a double layer of silicon oxide SiOx or silicon nitride SiNx to reduce permeation of moisture or impurities through the first substrate 110, like the above-described buffer layer 111, but is not limited thereto.

First, the active layer ACT of the driving transistor DT is disposed on the buffer layer 111. The active layer ACT may be formed of a semiconductor material such as an oxide semiconductor, amorphous silicon, or polysilicon, but is not limited thereto. Further, even though it is not illustrated in the drawings, another transistors, such as a switching transistor, a sensing transistor, and an emission control transistor, other than the driving transistor DT, may be further disposed. The active layers of the transistors are also formed of a semiconductor material, such as an oxide semiconductor, amorphous silicon, or polysilicon, but are not limited thereto. Further, the active layer of the transistor included in the pixel circuit, such as the driving transistor DT, the switching transistor, the sensing transistor, and the emission control transistor, may be formed of the same material, or formed of different materials from each other.

A gate insulating layer 112 is disposed on the active layer ACT. The gate insulating layer 112 is an insulating layer which electrically insulates the active layer ACT from the gate electrode GE and may be configured by a single layer or a double layer of silicon oxide (SiOx) or silicon nitride (SiNx), but is not limited thereto.

The gate electrode GE is disposed on the gate insulating layer 112. The gate electrode GE may be configured by a conductive material, such as copper (Cu), aluminum (Al), molybdenum (Mo), nickel (Ni), titanium (Ti), chrome (Cr), or an alloy thereof, but is not limited thereto.

A first interlayer insulating layer 113 and a second interlayer insulating layer 114 are disposed on the gate electrode GE. In the first interlayer insulating layer 113 and the second interlayer insulating layer 114, contact holes through which the source electrode SE and the drain electrode DE are connected to the active layer ACT are formed. The first interlayer insulating layer 113 and the second interlayer insulating layer 114 are insulating layers which protect components therebelow and may be configured by single layers or double layers of silicon oxide SiOx or silicon nitride SiNx, but is not limited thereto.

The source electrode SE and the drain electrode DE which are electrically connected to the active layer ACT are disposed on the second interlayer insulating layer 114. The source electrode SE is connected to the second capacitor C2 and the first electrode 134 of the light emitting diode 130 and the drain electrode DE is connected to the other configuration of the pixel circuit. The source electrode SE and the drain electrode DE may be configured by a conductive material, such as copper (Cu), aluminum (Al), molybdenum (Mo), nickel (Ni), titanium (Ti), chrome (Cr), or an alloy thereof, but are not limited thereto.

Next, the first capacitor C1 is disposed on the gate insulating layer 112. The first capacitor C1 includes a 1-1-th capacitor electrode C1a and a 1-2-th capacitor electrode C1b.

First, the 1-1-th capacitor electrode C1a is disposed on the gate insulating layer 112. The 1-1-th capacitor electrode C1a may be integrally formed with the gate electrode GE of the driving transistor DT.

The 1-2-th capacitor electrode C1b is disposed on the first interlayer insulating layer 113. The 1-2-th capacitor electrode C1b is disposed to overlap the 1-1-th capacitor electrode C1a with the first interlayer insulating layer 113 therebetween.

Therefore, the first capacitor C1 is connected to the gate electrode GE of the driving transistor DT to maintain a voltage of the gate electrode GE of the driving transistor DT for a predetermined period.

Next, the second capacitor C2 is disposed on the first substrate 110. The second capacitor C2 includes a 2-1-th capacitor electrode C2a, a 2-2-th capacitor electrode C2b, and a 2-3-th capacitor electrode C2c. The second capacitor C2 includes the 2-1-th capacitor electrode C2a which is a lower capacitor electrode, the 2-2-th capacitor electrode C2b which is an intermediate capacitor electrode, and the 2-3-th capacitor electrode C2c which is an upper capacitor electrode.

The 2-1-th capacitor electrode C2a is disposed on the first substrate 110. The 2-1-th capacitor electrode C2a is disposed on the same layer as the light shielding layer BSM and may be formed of the same material.

The 2-2-th capacitor electrode C2b is disposed on the buffer layer 111 and the gate insulating layer 112. The 2-2-th capacitor electrode C2b is disposed on the same layer as the gate electrode GE and may be formed of the same material.

The 2-3-th capacitor electrode C2c is disposed on the first interlayer insulating layer 113. The 2-3-th capacitor electrode C2c may be configured by a first layer C2c1 and a second layer C2c2. The first layer C2c1 of the 2-3-th capacitor electrode C2c may be formed on the same layer as the 1-2-th capacitor electrode C1b with the same material. The first layer C2c1 may be disposed to overlap the 2-1-th capacitor electrode C2a and the 2-2-th capacitor electrode C2b with the first interlayer insulating layer 113 therebetween.

The second layer C2c2 of the 2-3-th capacitor electrode C2c is disposed on the second interlayer insulating layer 114. The second layer C2c2 is a part extending from the source electrode SE of the driving transistor DT and may be connected to the first layer C2c1 through the contact hole of the second interlayer insulating layer 114.

Accordingly, the second capacitor C2 is electrically connected between the source electrode SE of the driving transistor DT and the light emitting diode 130 to increase capacitance inherent in the light emitting diode 130 and allow the light emitting diode 130 to emit light with a higher luminance.

A first passivation layer 115a is disposed on the driving transistor DT, the first capacitor C1, and the second capacitor C2. The first passivation layer 115a is an insulating layer which protects components below the first passivation layer 115a and may be configured by an inorganic material, such as silicon oxide SiOx or silicon nitride SiNx, but is not limited thereto.

A first planarization layer 116a is disposed on the first passivation layer 115a. The first planarization layer 116a may planarize an upper portion of the pixel circuit including the driving transistor DT. The first planarization layer 116a may be configured by a single layer or a double layer, and for example, configured by benzocyclobutene or an acrylic-based organic material, but is not limited thereto. Referring to FIGS. 4B and 5 together, a plurality of reflection plates RF is disposed on the first planarization layer 116a. The reflection plate RF is a configuration which reflects light emitted from the plurality of light emitting diodes 130 above the first substrate 110 and is formed with a shape corresponding to each of the plurality of sub pixels SP. One reflection plate RF may be disposed to cover the most area of one sub pixel SP. The reflection plate RF reflects the light emitted from the light emitting diode 130 and is also used as an electrode which electrically connects the light emitting diode 130 and the pixel circuit. Therefore, the reflection plate RF may include various conductive layers in consideration of a light reflection efficiency and a resistance. For example, the reflection plate RF may use an opaque conductive layer such as silver (Ag), aluminum (Al), molybdenum (Mo), titanium (Ti), or an alloy thereof and a transparent conductive layer such as indium tin oxide, but the structure of the reflection plate RF is not limited thereto.

The reflection plate RF includes a first reflection plate RF1 corresponding to the first sub pixel SP1, a second reflection plate RF2 corresponding to the second sub pixel SP2, a third reflection plate RF3 corresponding to the third sub pixel SP3, and a fourth reflection plate RF4 corresponding to the fourth sub pixel SP.

The first reflection plate RF1 includes a 1-1-th reflection plate RF1a overlapping most of the first sub pixel SP1 and a 1-2-th reflection plate RF1b overlapping the red light emitting diode 130R of the first sub pixel SP1. The 1-1-th reflection plate RF1a may reflect light emitted from the red light emitting diode 130R above the red light emitting diode 130R. Further, the 1-1-th reflection plate RF1a may be electrically connected to the source electrode SE of the driving transistor DT and the second capacitor C2 through a first contact hole CHI of the first planarization layer 116a and the first passivation layer 115a. Therefore, the 1-1-th reflection plate RF1a may electrically connect the driving transistor DT and the first electrode 134 of the red light emitting diode 130R. The 1-2-th reflection plate RF1b may reflect light emitted from the red light emitting diode 130R above the red light emitting diode 130R. Further, the 1-2-th reflection plate RF1b may serve as an electrode which electrically connects the second electrode 135 of the red light emitting diode 130R and the high potential power line VL1.

The second reflection plate RF2 includes a 2-1-th reflection plate RF2a overlapping most of the second sub pixel SP2 and a 2-2-th reflection plate RF2b overlapping the red light emitting diode 130R of the second sub pixel SP2. The 2-1-th reflection plate RF2a may reflect light emitted from the red light emitting diode 130R above the red light emitting diode 130R. The 2-1-th reflection plate RF2a is electrically connected to the source electrode SE of the driving transistor DT and the second capacitor C2 through the first contact hole CHI to transmit a driving current from the driving transistor DT to the first electrode 134 of the red light emitting diode 130R. Further, the 2-2-th reflection plate RF2b may be used as an electrode which reflects the light emitted from the red light emitting diode 130R above the red light emitting diode 130R and electrically connects the second electrode 135 of the red light emitting diode 130R to the high potential power line VL1.

The third reflection plate RF3 may be formed as one third reflection plate RF3 which overlaps the entire third sub pixel SP3. The third reflection plate RF3 may reflect light emitted from the green light emitting diode 130G of the third sub pixel SP3 above the green light emitting diode 130G. Further, the third reflection plate RF3 is electrically connected to the source electrode SE of the driving transistor DT and the second capacitor C2 through the first contact hole CHI to transmit a driving current from the driving transistor DT to the first electrode 134 of the green light emitting diode 130G.

The fourth reflection plate RF4 may be formed as one fourth reflection plate RF4 which overlaps the entire fourth sub pixel SP. The fourth reflection plate RF4 may reflect light emitted from the blue light emitting diode 130B of the fourth sub pixel SP above the blue light emitting diode

130B. Further, the fourth reflection plate RF4 is electrically connected to the source electrode SE of the driving transistor DT and the second capacitor C2 through the first contact hole CHI to transmit a driving current from the driving transistor DT to the first electrode 134 of the blue light emitting diode 130B.

In the meantime, even though it has been described that the first sub pixel SP1 and the second sub pixel SP2 are formed with two reflection plates RF and the third sub pixel SP3 and the fourth sub pixel SP are formed with one reflection plate RF, the reflection plate RF may be designed in various manners. For example, only one reflection plate RF may be disposed in all the plurality of sub pixels SP, like the third sub pixel SP3 and the fourth sub pixel SP or a plurality of reflection plates RF may be disposed in all the sub pixels like the first sub pixel SP1 and the second sub pixel SP2. However, the reflection plate is not limited thereto.

Further, it has been described that the red light emitting diode 130R of each of the first sub pixel SP1 and the second sub pixel SP2 is electrically connected to the high potential power line VL1 through the 1-2-th reflection plate RF1$b$ and the 2-2-th reflection plate RF2$b$. However, all the red light emitting diode 130R, the green light emitting diode 130G, and the blue light emitting diode 130B may be separately connected to the high potential power line VL1 without the reflection plate RF, but are not limited thereto.

Referring to FIG. 5, the second passivation layer 115$b$ is disposed on the plurality of reflection plates RF. The second passivation layer 115$b$ is an insulating layer which protects components below the second passivation layer 115$b$ and may be configured by a single layer or a double layer of silicon oxide SiOx or silicon nitride SiNx, but is not limited thereto.

An adhesive layer AD is disposed on the second passivation layer 115$b$. The adhesive layer AD is formed on the entire surface of the first substrate 110 to fix the light emitting diode 130 disposed on the adhesive layer AD. The adhesive layer AD may be formed of a photo curable adhesive material which is cured by light. For example, the adhesive layer AD may be formed of an acrylic-based material including a photoresist, but is not limited thereto. The adhesive layer AD may be formed on the entire surface of the first substrate 110 excluding a pad area in which the first pad electrode PAD1 is disposed.

The plurality of light emitting diodes 130 is disposed in the plurality of sub pixels SP on the adhesive layer AD. Each of the plurality of light emitting diodes 130 includes an element which emits light by a current. The plurality of light emitting diodes 130 includes a red light emitting diode 130R which emits red light, a green light emitting diode 130G which emits green light, and a light emitting diode 130B which emits blue light and implements light with various colors including white by a combination thereof. For example, the light emitting diode 130 may be a light emitting diode (LED) or a micro LED, but is not limited thereto.

One red light emitting diode 130R is disposed in each of the first sub pixel SP1 and the second sub pixel SP2, one pair of green light emitting diodes 130G is disposed in the third sub pixel SP3, and one pair of blue light emitting diodes 130B is disposed in the fourth sub pixel SP. That is, two red light emitting diodes 130R, two green light emitting diodes 130G, and two blue light emitting diodes 130B may be disposed in one pixel PX. At this time, each of the red light emitting diodes 130R is connected to the driving transistor DT of a corresponding one of the first sub pixel SP1 and the second sub pixel SP2 to be individually driven. In contrast, one pair of green light emitting diodes 130G of the third sub pixel SP3 and one pair of blue light emitting diodes 130B of the fourth sub pixel SP are connected to one driving transistor DT in parallel to be driven.

Each of the plurality of light emitting diodes 130 includes a first semiconductor layer 131, an emission layer 132, a second semiconductor layer 133, a first electrode 134, and a second electrode 135.

The first semiconductor layer 131 is disposed on the adhesive layer AD and the second semiconductor layer 133 is disposed on the first semiconductor layer 131. The first semiconductor layer 131 and the second semiconductor layer 133 may be layers formed by doping n-type and p-type impurities into a specific material. For example, the first semiconductor layer 131 and the second semiconductor layer 133 may be layers doped with n type and p type impurities into a material such as gallium nitride (GaN), indium aluminum phosphide (InAlP), or gallium arsenide (GaAs). The p-type impurity may be magnesium (Mg), zinc (Zn), and beryllium (Be), and the n-type impurity may be silicon (Si), germanium (Ge), and tin (Sn), but the present disclosure is not limited thereto.

The emission layer 132 is disposed between the first semiconductor layer 131 and the second semiconductor layer 133. The emission layer 132 is supplied with holes and electrons from the first semiconductor layer 131 and the second semiconductor layer 133 to emit light. The emission layer 132 may be formed by a single layer or a multi-quantum well (MQW) structure, and for example, may be formed of indium gallium nitride (InGaN) or gallium nitride (GaN), but is not limited thereto.

The first electrode 134 is disposed on the first semiconductor layer 131. The first electrode 134 is an electrode which electrically connects the driving transistor DT and the first semiconductor layer 131. In this case, the first semiconductor layer 131 is a semiconductor layer doped with an n-type impurity and the first electrode 134 may be a cathode. The first electrode 134 may be disposed on a top surface of the first semiconductor layer 131 which is exposed from the emission layer 132 and the second semiconductor layer 133. The first electrode 134 may be configured by a conductive material, for example, a transparent conductive material, such as indium tin oxide (ITO) or indium zinc oxide (IZO) or an opaque conductive material, such as titanium (Ti), gold (Au), silver (Ag), copper (Cu) or an alloy thereof, but is not limited thereto.

The second electrode 135 is disposed on the second semiconductor layer 133. The second electrode 135 may be disposed on the top surface of the second semiconductor layer 133. The second electrode 135 is an electrode which electrically connects the high potential power line VL1 and the second semiconductor layer 133. In this case, the second semiconductor layer 133 is a semiconductor layer doped with a p-type impurity and the second electrode 135 may be an anode. The second electrode 135 may be configured by a conductive material, for example, a transparent conductive material, such as indium tin oxide (ITO) or indium zinc oxide (IZO) or an opaque conductive material, such as titanium (Ti), gold (Au), silver (Ag), copper (Cu) or an alloy thereof, but is not limited thereto.

Next, the encapsulation film 136 which surrounds the first semiconductor layer 131, the emission layer 132, the second semiconductor layer 133, the first electrode 134, and the second electrode 135 is disposed. The encapsulation film 136 is formed of an insulating material to protect the first semiconductor layer 131, the emission layer 132, and the second semiconductor layer 133. In the encapsulation film 136, contact holes which expose the first electrode 134 and the second electrode 135 are formed to electrically connect a first connection electrode CE1 and a second connection layer CE2 to the second electrode 135 and the first electrode 134.

In the meantime, a part of the side surface of the first semiconductor layer 131 may be exposed from the encapsulation film 136. The light emitting diode 130 manufactured on the wafer is separated from the wafer to be transferred onto the display panel PN. However, during the process of separating the light emitting diode 130 from the wafer, a part of the encapsulation film 136 may be torn. For example, a part of the encapsulation film 136 which is adjacent to a lower edge of the first semiconductor layer 131 of the light emitting diode 130 is torn during the process of separating the light emitting diode 130 from the wafer. Accordingly, a part of a lower side surface of the first semiconductor layer 131 may be exposed to the outside. However, even though the lower portion of the light emitting diode 130 is exposed from the encapsulation film 136, the first connection electrode CE1 and the second connection electrode CE2 are formed after forming the second planarization layer 116b and the third planarization layer 116c which cover the side surface of the first semiconductor layer 131. Accordingly, a short defect may be reduced.

Next, the second planarization layer 116b and the third planarization layer 116c are disposed on the adhesive layer AD and the light emitting diode 130.

The second planarization layer 116b overlaps a part of side surfaces of the plurality of light emitting diodes 130 to fix and protect the plurality of light emitting diodes 130. The second planarization layer 116b may be formed using a halftone mask. Therefore, the second planarization layer 116b may be formed to have a step.

Specifically, a part of the second planarization layer 116b which is relatively adjacent to the light emitting diode 130 is formed to have a smaller thickness, and a part of the second planarization layer 116b which is farther away from the light emitting diode 130 is formed to have a larger thickness. A part of the second planarization layer 116b which is adjacent to the light emitting diode 130 is disposed to surround the light emitting diode 130 and also may be in contact with a side surface of the light emitting diode 130. Therefore, a torn part of the encapsulation film 136 which protects a side surface of the first semiconductor layer 131 of the light emitting diode 130 during the process of separating the light emitting diode 130 from the wafer to be transferred onto the display panel PN may be covered by the second planarization layer 116b. By doing this, contacts and short problems of the connection electrodes CE1 and CE2 and the first semiconductor layer 131 thereafter may be suppressed later.

The third planarization layer 116c is formed to cover upper portions of the second planarization layer 116b and the light emitting diode 130, and contact holes which expose the first electrode 134 and the second electrode 135 of the light emitting diode 130 may be formed. The first electrode 134 and the second electrode 135 of the light emitting diode 130 are exposed from (or through the contact holes of) the third planarization layer 116c, and the third planarization layer 116c is partially disposed in an area between the first electrode 134 and the second electrode 135 to reduce a short defect (to reduce a defect via short). The second planarization layer 116b and the third planarization layer 116c may be configured by a single layer or a double layer, and for example, may be formed of photoresist or an acrylic-based organic material, but are not limited thereto.

In the meantime, the third planarization layer 116c may cover only the light emitting diode 130 and an area adjacent to the light emitting diode 130. The third planarization layer 116c is disposed in an area of the sub pixel SP surrounded by the bank BB and may be disposed in an island shape. Therefore, the bank BB is disposed in a part of the top surface of the second planarization layer 116b, and the third planarization layer 116c may be disposed in the other part of the top surface of the second planarization layer 116b.

The first connection electrode CE1 and the second connection electrode CE2 are disposed on the third planarization layer 116c. The first connection electrode CE1 is an electrode which electrically connects the second electrode 135 of the light emitting diode 130 and the high potential power line VL1. The first connection electrode CE1 may be electrically connected to the second electrode 135 of the light emitting diode 130 through a contact hole formed in the third planarization layer 116c.

The second connection electrode CE2 is an electrode which electrically connects the first electrode 134 of the light emitting diode 130 and the driving transistor DT. The second connection electrode CE2 may be connected to the 1-1-th reflection plate RF1a, the 1-2-th reflection plate RF1b, the third reflection plate RF3, and the fourth reflection plate RF4 of each of the plurality of sub pixels SP through contact holes formed in the third planarization layer 116c, the second planarization layer 116b, the adhesive layer AD, and the second passivation layer 115b. At this time, the 1-1-th reflection plate RF1a, the 1-2-th reflection plate RF1b, the third reflection plate RF3, and the fourth reflection plate RF4 are also connected to the source electrode SE of the driving transistor DT so that the source electrode SE of the driving transistor DT and the first electrode 134 of the light emitting diode 130 may be electrically connected to each other.

In the meantime, in the drawing, it is illustrated that the first electrode 134, the second connection electrode CE2, and the reflection plate RF are electrically connected to the source electrode SE of the driving transistor DT. However, the first electrode 134, the second connection electrode CE2, and the reflection plate RF may be connected to the drain electrode DE of the driving transistor DT, but they are not limited thereto.

A bank BB is disposed on the second planarization layer 116b exposed from (or through) the first connection electrode CE1 and the second connection electrode CE2, and the third planarization layer 116c. The bank BB may be disposed to be spaced apart from the light emitting diode 130 with a predetermined interval and overlap at least partially the reflection plate RF. For example, the bank BB may cover a part of the second connection electrode CE2 formed in the contact holes of the third planarization layer 116c and the second planarization layer 116b. Further, the bank BB may be disposed on the second planarization layer 116b with a predetermined interval from the light emitting diode 130. In this case, the bank BB and the third planarization layer 116c may be spaced apart from each other on a part of the second planarization layer 116b having a smaller thickness. That is, an end of the bank BB and an end of the third planarization layer 116c may be disposed on a part of the second planarization layer 116b having a smaller thickness formed by a halftone mask process to be spaced apart from each other.

The bank BB may be formed of an opaque material to reduce color mixture between the plurality of sub pixels SP and for example, may be formed of black resin, but is not limited thereto.

In the meantime, a thickness of a part of the bank BB which is formed in the contact holes of the third planarization layer 116c and the second planarization layer 116b to cover a part of the second connection electrode CE2 and a thickness of a part of the bank BB disposed on the second planarization layer 116b may be different from each other. Specifically, when the part of the bank BB covers a part of the second connection electrode CE2 formed in the contact holes of the third planarization layer 116c and the second planarization layer 116b, since the contact holes are formed from the second passivation layer 115b to the third planarization layer 116c, the bank BB (or at least a bottom portion of the bank BB) may be disposed below the light emitting diode 130, that is, disposed to be lower than the light emitting diode 130. Therefore, the thickness of the part of the bank BB which covers a part of the second connection electrode CE2 formed in the contact holes of the third planarization layer 116c and the second planarization layer 116b may be greater than the thickness of a part of the bank BB disposed on the second planarization layer 116b.

A first protection layer 117 is disposed on the first connection electrode CE1, the second connection electrode CE2, and the bank BB. The first protection layer 117 is a layer which protects components below the first protection layer 117. The first protection layer 117 may be configured by a single layer or a double layer, and for example, configured by benzocyclobutene, a light-transmitting epoxy, a photoresist, or an acrylic-based organic material, but is not limited thereto.

An encapsulation layer 160 is disposed on the first protection layer 117. The encapsulation layer 160 is a layer which minimizes the moisture permeation from the outside of the display device 100 to encapsulate a component surrounded by the encapsulation layer 160. As it is described below, the encapsulation layer 160 may be disposed to surround front surfaces, side surfaces, and rear surfaces of the first substrate 110 and the second substrate 120.

The encapsulation layer 160 may be formed of a material having a low vapor permeability and a high insulating property. For example, the encapsulation layer 160 may be formed of a material including parylene, but is not limited thereto.

The encapsulation layer 160 is described in more detail later with reference to FIGS. 6 to 9.

Referring to FIG. 5, an optical film MF which covers an upper portion of the encapsulation layer 160 is disposed in the entire area of the top of the first substrate 110. The optical film MF may be a functional film which implements a higher quality of images while protecting the display device 100. For example, the optical film MF may include an anti-scattering film, an anti-glare film, an anti-reflecting film, a low-reflecting film, an OLED transmittance controllable film, or a polarizer, but is not limited thereto.

An adhering unit 118 is disposed between the first protection layer 117 and the optical film MF. The adhering unit 118 is formed on the front surface of the first substrate 110 to form a bond between the first protection layer 117 and the optical film MF. The adhering unit 118 may be formed of a photo curable adhesive material which is cured by light. For example, the adhering unit 118 may be formed of an acrylic-based material including a photoresist, but is not limited thereto.

In the meantime, in one or more examples of the present disclosure, the adhering unit 118 and the optical film MF are defined as separate components, but the present disclosure is not limited thereto, and the optical film MF and the adhering unit 118 may be defined as one component.

Hereinafter, a front surface and a rear surface of the display device 100 according to one or more example embodiments of the present disclosure are described in detail with reference to FIGS. 6 and 7.

Figure 6:
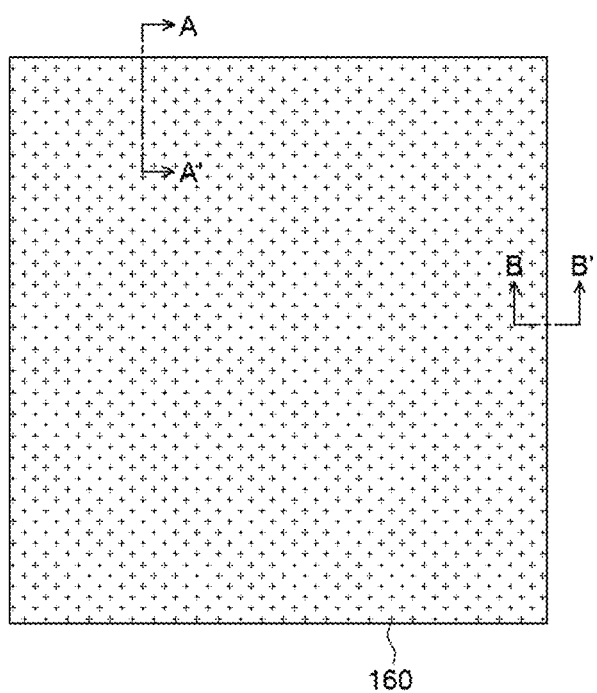
FIG. 6 is a schematic top plan view for explaining an encapsulation layer of a display device according to one or more example embodiments of the present disclosure.

FIG. 6 is a schematic top plan view for explaining an encapsulation layer of a display device according to one or more example embodiments of the present disclosure. FIG. 7 is a schematic rear view for explaining an encapsulation layer of a display device according to one or more example embodiments of the present disclosure. In FIGS. 6 and 7, for the convenience of description, among various configurations of the display device 100, only the encapsulation layer 160 is illustrated.

Figure 7:
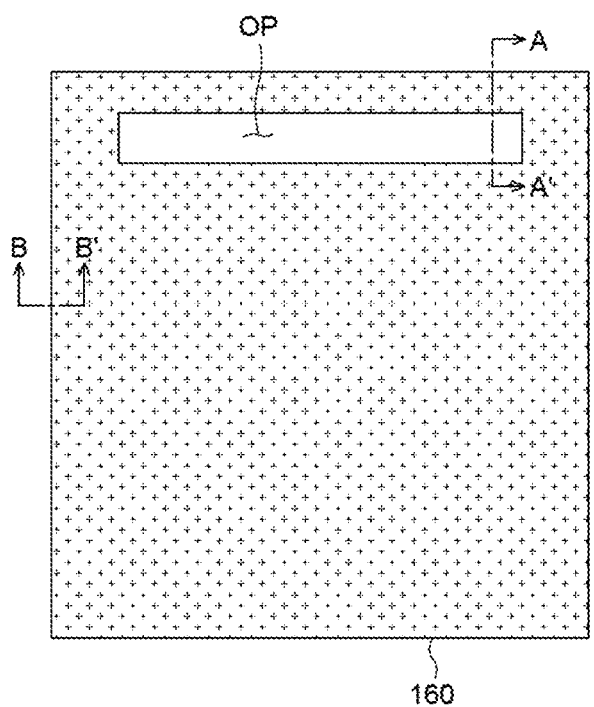
FIG. 7 is a schematic rear view for explaining an encapsulation layer of a display device according to one or more example embodiments of the present disclosure.

First, referring to FIGS. 6 and 7, the encapsulation layer 160 may surround front surfaces, rear surfaces, and side surfaces of the first substrate 110 and the second substrate 120. The encapsulation layer 160 may be disposed so as to surround the first substrate 110 and the second substrate 120 to minimize the moisture which permeates to the first substrate 110 and the second substrate 120.

Referring to FIG. 7, an opening OP which exposes the plurality of second pad electrodes PAD2 on the rear surface of the second substrate 120 may be disposed in the encapsulation layer 160. That is, the flexible film COF needs to be bonded to the plurality of second pad electrodes PAD2 so that an opening OP which allows the flexible film COF to be connected to the plurality of second pad electrodes PAD2 may be disposed in the encapsulation layer 160.

Hereinafter, the encapsulation layer 160 of the display device 100 according to one or more example embodiments of the present disclosure is described in detail with reference to FIGS. 8 and 9.

Figure 8:
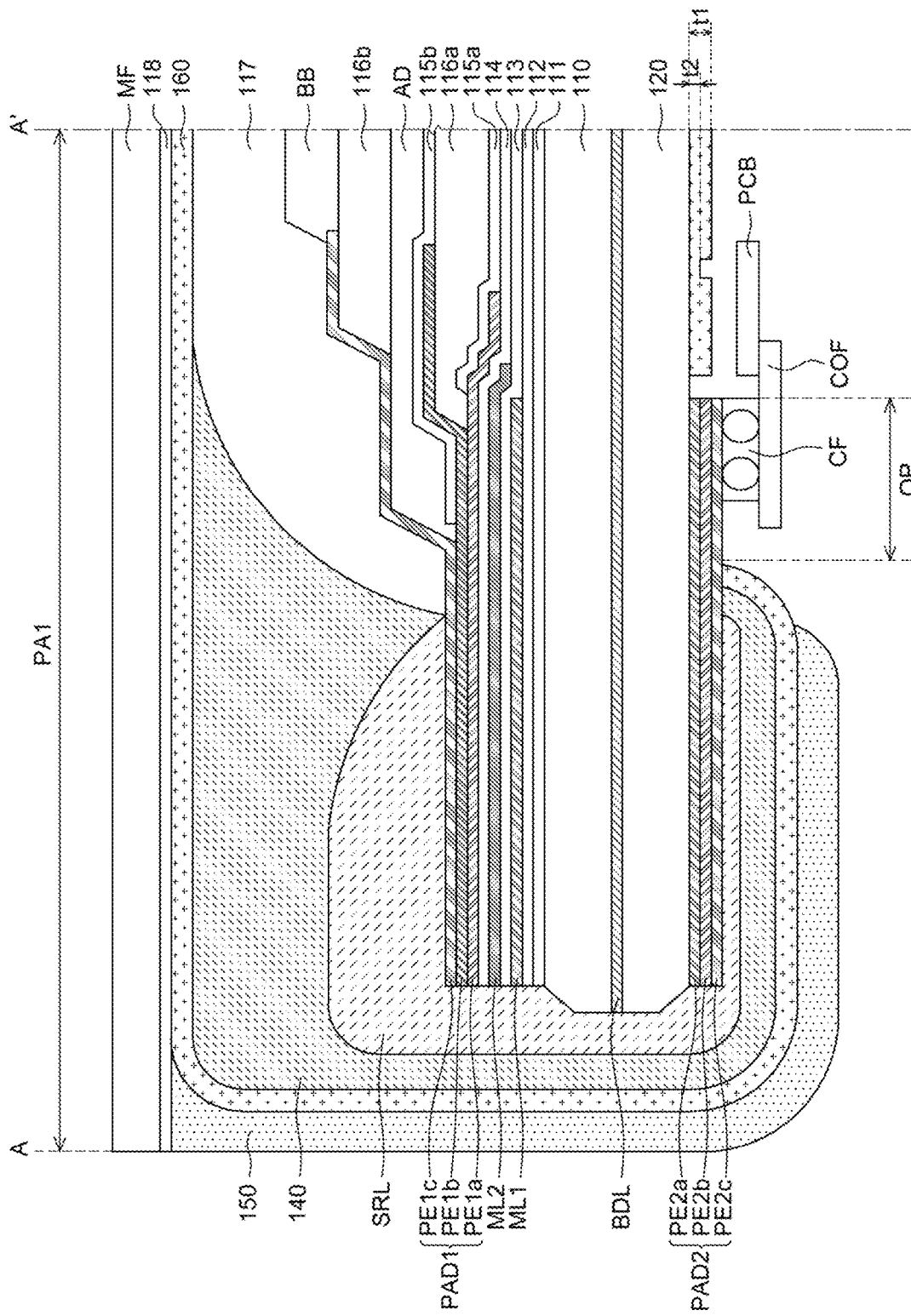
FIG. 8 is an example cross-sectional view taken along the line A-A' of FIGS. 6 and 7.
Figure 9:
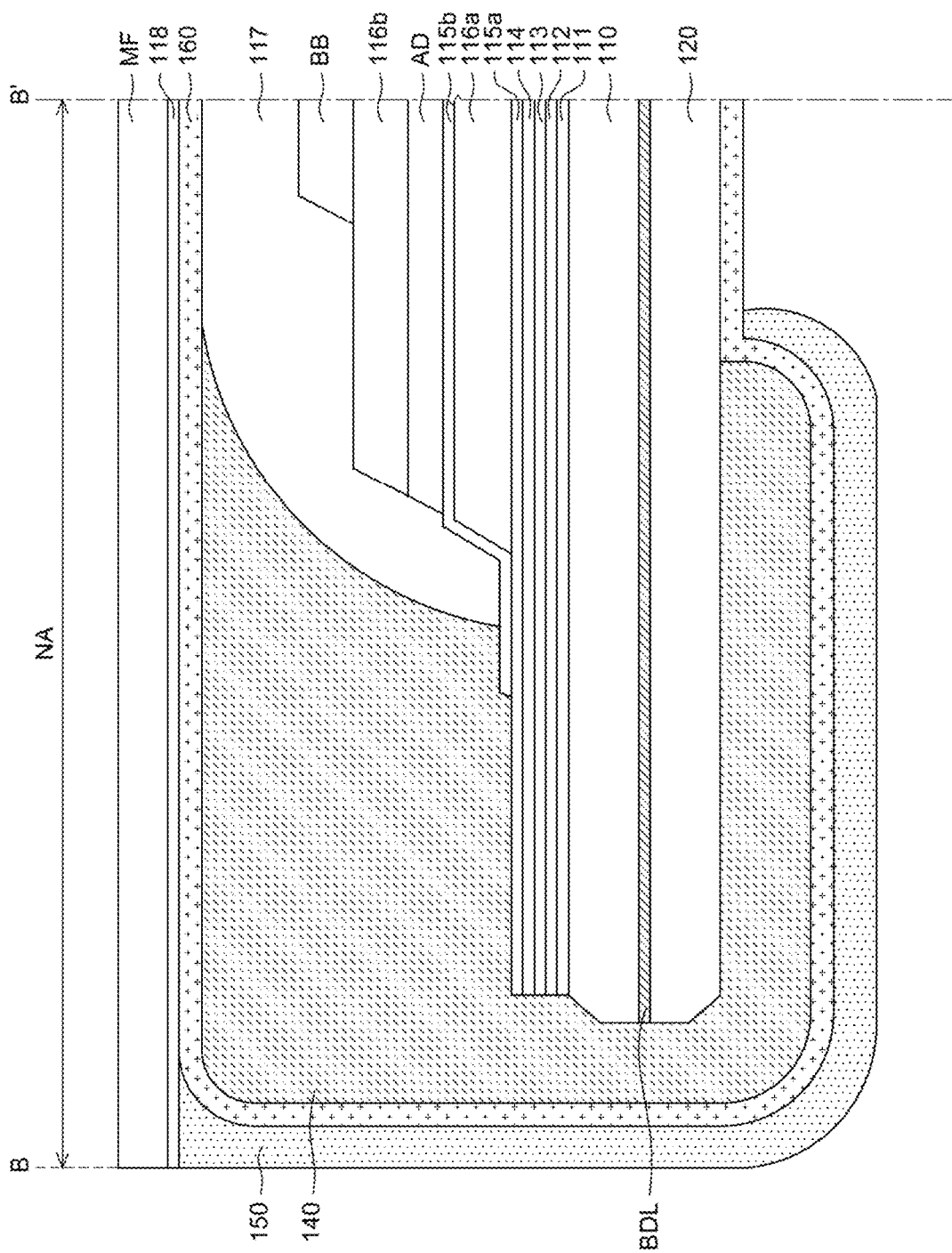
FIG. 9 is an example cross-sectional view taken along B-B' of FIGS. 6 and 7.

FIG. 8 is an example cross-sectional view taken along the line A-A' of FIGS. 6 and 7, and FIG. 9 is an example cross-sectional view taken along B-B' of FIGS. 6 and 7. FIG. 8 is a cross-sectional view for explaining a first pad area PA1 of the display device 100 according to one or more example embodiments of the present disclosure and FIG. 9 is a cross-sectional view for explaining a non-active area NA other than a plurality of pad areas of a display device 100 according to one or more example embodiments of the present disclosure.

Referring to FIG. 8, a plurality of first pad electrodes PAD1 is disposed in a first pad area PA1 and a second pad area PA2 of the first substrate 110. Each of the plurality of first pad electrodes PAD1 may be configured by a plurality of conductive layers. For example, each of the plurality of first pad electrodes PAD1 includes a first conductive layer PE1a, a second conductive layer PE1b, and a third conductive layer PE1c.

First, the first conductive layer PE1a is disposed on the second interlayer insulating layer 114. The first conductive layer PE1a may be formed of the same conductive material as the source electrode SE and the drain electrode DE and for example, may be configured by (or may include) copper (Cu), aluminum (Al), molybdenum (Mo), nickel (Ni), titanium (Ti), chrome (Cr), or an alloy thereof, but is not limited thereto.

The first passivation layer 115a is disposed on the first conductive layer PE1a. The first passivation layer 115a extends from the active area AA to the non-active area NA. Referring to FIG. 8, the first passivation layer 115a is disposed so as to cover an end of the first conductive layer PE1a in an area overlapping the plurality of first pad electrodes PAD1. Referring to FIG. 9, the first passivation layer 115a may extend to an area of the non-active area which does not overlap the plurality of first pad electrode PAD1, that is, between the plurality of first pad electrodes PAD1 and an outermost side of a top surface of the first substrate 110 in the left and right non-active areas NA of the first substrate 110.

Referring to FIG. 8, the first planarization layer 116a is disposed on the first conductive layer PE1a and the first passivation layer 115a. Still referring to FIG. 8, the first planarization layer 116a covers an end of the first passivation layer 115a in an area overlapping the plurality of first pad electrodes PAD1. Therefore, the first planarization layer 116a covers the first passivation layer 115a to suppress the damage that may be caused in (or may result in) the first passivation layer 115a which is an inorganic insulating layer during a subsequent process.

The second conductive layer PE1b is disposed on the first conductive layer PE1a, the first passivation layer 115a, and the first planarization layer 116a. The second conductive layer PE1b is formed of the same conductive material as the reflection plate RF and for example, may be configured by silver (Ag), aluminum (Al), molybdenum (Mo), or an alloy thereof, but is not limited thereto.

The second passivation layer 115b is disposed on the second conductive layer PE1b and the first planarization layer 116a. The second passivation layer 115b extends from the active area AA to the non-active area NA to cover the first planarization layer 116a.

Referring to FIGS. 8 and 9, the second passivation layer 115b is disposed to cover one end of the second conductive layer PE1b in an area overlapping the plurality of first pad electrodes PAD1 and is disposed to be in contact with the first passivation layer 115a.

Referring to FIG. 9, the second passivation layer 115b covers the first planarization layer 116a in a non-active area other than the plurality of pad areas, and an end of the second passivation layer 115b is disposed on the first passivation layer 115a.

An adhesive layer AD is disposed on the second passivation layer 115b. The adhesive layer AD extends from the pixel area UPA to the non-active area NA. Referring to FIGS. 8 and 9, the end of the adhesive layer AD is disposed at the outside from the end of the first planarization layer 116a in the non-active area NA. Therefore, the adhesive layer AD may alleviate the step created by the first planarization layer 116a.

Referring to FIG. 8, in the area overlapping the plurality of first pad electrodes PAD1, the adhesive layer AD is disposed so as to cover an end of the second passivation layer 115b. Referring to FIG. 9, the adhesive layer AD is disposed so as to cover an end of the second passivation layer 115b also in the non-active area NA other than the plurality of pad areas.

The third conductive layer PE1c is disposed on the second conductive layer PE1b and the adhesive layer AD. The third conductive layer PE1c is formed of the same conductive material as the first connection electrode CE1 and the second connection electrode CE2, and may include, for example, a transparent conductive material, such as indium tin oxide (ITO) or indium zinc oxide (IZO), but is not limited thereto.

At this time, even though it is not illustrated in FIG. 8, a part of the plurality of conductive layers of the first pad electrode PAD1 is electrically connected to a plurality of wiring lines on the first substrate 110 to supply various signals to a plurality of wiring lines and a plurality of sub pixels SP (see, e.g., FIGS. 3A and 3B). For example, the first conductive layer PE1a and/or the second conductive layer PE1b of the first pad electrode PAD1 is connected to the data line DL, the high potential power line VL1, and the low potential power line VL2 disposed in the active area AA to transmit signals thereto.

Further, a first metal layer ML1, a second metal layer ML2, and a plurality of insulating layers may be disposed together below the first pad electrode PAD1.

The plurality of metal layers includes a first metal layer ML1 and a second metal layer ML2 on the first metal layer ML1. The first metal layer ML1 and the second metal layer ML2 may be disposed together with the plurality of insulating layers below the first pad electrodes PAD1, for example, the buffer layer 111, the gate insulating layer 112, the first interlayer insulating layer 113, and the second interlayer insulating layer 114. Therefore, the plurality of metal layers may be insulated from the plurality of first pad electrodes PAD1. In the meantime, the plurality of metal layers may not be electrically connected to the other components, and may be electrically floated.

In the display device 100 according to one or more example embodiments of the present disclosure, the first metal layer ML1, the second metal layer ML2, and the plurality of insulating layers are disposed below the first pad electrode PAD1 to adjust a step of the first pad electrode PAD1. For example, the buffer layer 111, the gate insulating layer 112, the first metal layer ML1, the first interlayer insulating layer 113, and the second metal layer ML2 may be sequentially disposed between the first pad electrode PAD1 and the first substrate 110.

The first metal layer ML1 may be formed of the same conductive material as the gate electrode GE, and the second metal layer ML2 may be formed of the same conductive material as a 1-2-th capacitor electrode C1b. However, the plurality of insulating layers, the first metal layer ML1, and the second metal layer ML2 below the first pad electrode PAD1 may be omitted depending on a design and are not limited thereto.

Referring to FIGS. 8 and 9 together, a second substrate 120 is disposed below the first substrate 110. The second substrate 120 is a substrate which supports components disposed below the display device 100 and may be an insulating substrate. For example, the second substrate 120 may be formed of glass or resin. Further, the second substrate 120 may include polymer or plastic. The second substrate 120 may be formed of the same material as the first substrate 110. In some example embodiments, the second substrate 120 may be formed of a plastic material having flexibility.

A bonding layer BDL is disposed between the first substrate 110 and the second substrate 120. The bonding layer BDL is formed of a material which is cured by various curing methods to bond the first substrate 110 and the second substrate 120. The bonding layer BDL may be disposed only in a partial area between the first substrate 110 and the second substrate 120 or may be disposed in the entire area therebetween.

A plurality of second pad electrodes PAD2 is disposed on a rear surface of the second substrate 120. The plurality of second pad electrodes PAD2 is electrodes which transmit signals from a driving component(s) disposed on the rear surface of the second substrate 120 to a plurality of side lines SRL, a plurality of first pad electrodes PAD1 and a plurality of wiring lines on the first substrate 110. The plurality of second pad electrodes PAD2 is disposed in an end portion of the second substrate 120 in the non-active area NA to be electrically connected to the side lines SRL which cover the end portion of the second substrate 120.

At this time, the plurality of second pad electrodes PAD2 may also be disposed so as to correspond to the plurality of pad areas. The plurality of first pad electrodes PAD1 may be disposed to correspond to the plurality of second pad electrodes PAD2, respectively, and then the first pad electrode PAD1 and the second pad electrode PAD2 which overlap each other may be electrically connected through the side line SRL.

Each of the plurality of second pad electrodes PAD2 includes a plurality of conductive layers. For example, each of the plurality of second pad electrodes PAD2 includes a fourth conductive layer PE2a, a fifth conductive layer PE2b, and a sixth conductive layer PE2c.

First, the fourth conductive layer PE2a is disposed below the second substrate 120. The fourth conductive layer PE2a may be configured by a conductive material such as copper (Cu), aluminum (Al), molybdenum (Mo), nickel (Ni), titanium (Ti), chrome (Cr), or an alloy thereof, but is not limited thereto.

The fifth conductive layer PE2b is disposed below the fourth conductive layer PE2a. The fifth conductive layer PE2b may be configured by a conductive material, such as copper (Cu), aluminum (Al), molybdenum (Mo), nickel (Ni), titanium (Ti), chrome (Cr), or an alloy thereof, but is not limited thereto.

The sixth conductive layer PE2c is disposed below the fifth conductive layer PE2b. The sixth conductive layer PE2c is formed of a conductive material, for example, a transparent conductive material, such as indium tin oxide (ITO) or indium zinc oxide (IZO), but is not limited thereto.

Next, the plurality of side lines SRL is disposed on the side surfaces of the first substrate 110 and the second substrate 120. The plurality of side lines SRL may electrically connect the plurality of first pad electrodes PAD1 formed on the top surface of the first substrate 110 and the plurality of second pad electrodes PAD2 formed on the rear surface of the second substrate 120. The plurality of side lines SRL may be disposed so as to surround the side surface(s) of the display device 100. Each of the plurality of side lines SRL may cover the first pad electrode PAD1 at an end portion of the first substrate 110, a side surface of the first substrate 110, a side surface of the second substrate 120, and the second pad electrode PAD2 at an end portion of the second substrate 120. For example, the plurality of side lines SRL may be formed by a pad printing method using a conductive ink including silver (Ag), copper (Cu), molybdenum (Mo), and chrome (Cr).

A side insulating layer 140 which covers the plurality of side lines SRL is disposed. The side insulating layer 140 may be formed on the top surface of the first substrate 110, the side surface(s) of the first substrate 110, the side surface(s) of the second substrate 120, and the rear surface of the second substrate 120 to cover the side lines SRL. The side insulating layer 140 may protect the plurality of side lines SRL.

In the meantime, when the plurality of side lines SRL is formed of a metal material, there may be a problem in that external light is reflected from the plurality of side lines SRL or light emitted from the light emitting diode 130 is reflected from the plurality of side lines SRL to be visibly recognized by the user. Therefore, the side insulating layer 140 is configured to include a black material to suppress reflection of the external light. For example, the side insulating layer 140 may be formed by a pad printing method using an insulating material including a black material, for example, a black ink.

The encapsulation layer 160 which covers the side insulating layer 140 is disposed. The encapsulation layer 160 is a layer which minimizes the moisture permeation from the outside of the display device 100 to encapsulate a component(s) surrounded by the encapsulation layer 160. The encapsulation layer 160 may be disposed to surround front surfaces, side surfaces, and rear surfaces of the first substrate 110 and the second substrate 120.

In the meantime, an edge of the seal member 150 and an edge of the optical film MF may be disposed on the same line. The optical film MF having a larger size is attached above the first substrate 110 during the manufacturing process of the display device 100 and the seal member 150 which covers the side insulating layer 140 may be formed. Thereafter, laser is irradiated on the seal member 150 and the optical film MF so as to correspond to an edge of the display device 100 to cut a part of the seal member 150 and the optical film MF. Accordingly, the size of the display device 100 is adjusted by an outer periphery cutting process of the seal member 150 and the optical film MF and the edge of the display device 100 may be formed to be flat.

Referring to FIG. 8, an opening OP which exposes the plurality of second pad electrodes PAD2 is disposed in (or is provided in) the encapsulation layer 160 which surrounds the rear surface of the second substrate 120. That is, in order to provide a space in which the flexible film COF and the printed circuit board PCB are connected to the second pad electrodes PAD2, an opening OP which exposes the plurality of second pad electrodes PAD2 may be disposed in the encapsulation layer 160.

The conductive adhesive layer CF may be disposed in (or provided) the opening OP to bond the plurality of second pad electrodes PAD2 and the flexible film COF. Specifically, the conductive adhesive layer CF may be disposed so as to be in contact with the second pad electrode PAD2 in the opening OP.

The conductive adhesive layer CF is in a state in which fine conductive particles are dispersed in an adhesive resin. For example, the conductive adhesive layer CF may be an anisotropic conducting film (ACF), but is not limited thereto.

The flexible film COF which is electrically connected to the plurality of second pad electrodes PAD2 through the conductive adhesive layer CF is disposed. The flexible films COF are components in which various components such as a driving IC are disposed on a base film having a ductility to supply signals to the plurality of sub pixels SP.

Further, the printed circuit board PCB which is electrically connected to the flexible film COF is disposed. The printed circuit board PCB is a component which is electrically connected to the flexible films COF to supply signals to the driving IC. On the printed circuit board PCB, various components for supplying various signals to the driving IC may be disposed. The printed circuit board PCB may supply various signals to the plurality of sub pixels SP through the flexible film COF, the conductive adhesive layer CF, the plurality of second pad electrodes PAD2, the plurality of side lines SRL, and the plurality of first pad electrodes PAD1.

In the meantime, a part of the encapsulation layer 160 which surrounds the rear surface of the second substrate 120 has a first thickness t1, and the other part of the encapsulation layer 160 has a second thickness t2 which is smaller than the first thickness t1, but is not limited thereto. Further, a thickness of the encapsulation layer 160 which surrounds the front surface of the first substrate 110 may be equal to or greater than a thickness of the encapsulation layer 160 which surrounds the rear surface of the second substrate 120. For example, the thickness of the encapsulation layer 160 which surrounds the front surface of the first substrate 110 may be equal to the first thickness t1.

The encapsulation layer 160 may be formed by a deposition method. Specifically, the encapsulation layer 160 may be formed by thermally depositing parylene in a chamber as an example. At this time, the first substrate 110 and the second substrate 120 may be disposed on a plurality of jigs to thermally deposit parylene. Therefore, in an area which is not in contact with the plurality of jigs, the encapsulation layer 160 may be disposed with the same thickness so as to surround the front surfaces, the rear surfaces, and the side surfaces of the first substrate 110 and the second substrate 120. However, in an area which is in contact with the plurality of jigs, parylene is deposited also between the plurality of jigs and the second substrate 120, but the encapsulation layer 160 may be formed to have a thickness smaller than the other area. Further, the encapsulation layer 160 which is disposed in an area in which the opening OP will be formed is removed to form the opening OP. Therefore, as illustrated in FIG. 8, a part of the encapsulation layer 160 which surrounds the rear surface of the second substrate 120 has a first thickness t1 and the other part has a second thickness t2 which is smaller than the first thickness t1, but when the encapsulation layer 160 is formed by another method, it is not limited thereto.

In order to implement a tiling display device, a side line which electrically connects a first pad electrode on the front surface of the display panel and a second pad electrode on a rear surface of the display panel is used. The side line is formed using a conductive ink, and for example, a conductive ink including silver (Ag) is representatively used. However, as described above, silver (Ag) is very vulnerable to moisture and may cause a migration failure due to a potential difference from a surrounding conductive component. When such a migration failure occurs, a short defect between the side line and other conductive component disposed to be adjacent to the side line may occur. When such a short defect occurs, defects in which a bright spot, a dark spot, a bright line, or a dark line is visible may occur.

Therefore, the display device 100 according to one or more example embodiments of the present disclosure includes an encapsulation layer 160 to minimize moisture permeation from the outside of the display device 100. The encapsulation layer 160 is formed of a material having a low water permeability and a high insulating property, and for example, formed of parylene. Further, the encapsulation layer 160 may be disposed to surround the front surfaces, the rear surfaces, and the side surfaces of the first substrate and the second substrate 120. That is, the encapsulation layer 160 may protect other components surrounded by the encapsulation layer 160 in all areas excluding an area in which an opening OP corresponding to the plurality of second pad electrodes to be bonded with the flexible film COF is disposed. Accordingly, in the display device 100 according to one or more example embodiments of the present disclosure, moisture permeation from the outside of the display device 100 may be minimized using the encapsulation layer 160. Therefore, the reliability of the display device 100 may be improved by improving the migration failure and a short defect caused by the migration failure, and also suppressing corrosion.

In one or more examples a substrate may refer to, or may include, the first substrate 110, the second substrate 120, or both of the first and second substrates.

Various examples and aspects of the present disclosure are described below. These are provided as examples, and do not limit the scope of the present disclosure.

According to one or more aspects of the present disclosure, there is provided a display device. The display device may include a substrate; an active area in which a plurality of sub pixels is disposed; a non-active area which surrounds the active area; a plurality of first pad electrodes which is disposed in the non-active area on a front surface of the substrate to transmit an electrical signal(s) to the plurality of sub pixels; a plurality of second pad electrodes which is disposed in the non-active area on a rear surface of the substrate to be electrically connected to a printed circuit board; a plurality of side lines which is disposed on the front surface, the rear surface, and a side surface of the substrate to electrically connect the plurality of first pad electrodes and the plurality of second pad electrodes; a side insulating layer which surrounds the plurality of side lines and includes a black material; an encapsulation layer which surrounds the front surface, the rear surface, and the side surface of the substrate; and a seal member which surrounds a part of the encapsulation layer.

The encapsulation layer may comprise a material including parylene.

The encapsulation layer may surround an entire front surface and an entire side surface of the substrate.

An opening which exposes the plurality of second pad electrodes on the rear surface of the substrate may be disposed in the encapsulation layer.

The display device may further comprise a conductive adhesive layer disposed in the opening; and a flexible film which electrically connects the plurality of second pad electrodes and the printed circuit board using the conductive adhesive layer.

A thickness of the encapsulation layer which surrounds the front surface of the substrate may be equal to or greater than a thickness of the encapsulation layer which surrounds the rear surface of the substrate.

A part of the encapsulation layer which surrounds the rear surface of the substrate may have a first thickness, and another part of the encapsulation layer has a second thickness smaller than the first thickness.

The display device may further comprise an optical film which is disposed on the front surface of the substrate and the encapsulation layer.

The seal member may be disposed so as to surround the encapsulation layer disposed on the side surface of the substrate.

The plurality of side lines may include a material including silver (Ag), and the encapsulation layer may be disposed so as to cover the plurality of side lines.

The active area further may include a plurality of gate driving areas which extends from the plurality of sub pixels and includes a gate driver disposed in the plurality of gate driving areas.

Active layers of a plurality of transistors disposed in the plurality of sub pixels and active layers of a plurality of transistors disposed in the gate driver may comprise oxide semiconductor, amorphous silicon, or polysilicon.

The plurality of transistors disposed in the gate driver may include active layers having different materials.

According to one or more aspects of the present disclosure, a display device may include a substrate; an active area in which a plurality of sub pixels is disposed; a non-active area which surrounds the active area; a plurality of first pad electrodes which is disposed in the non-active area on a front surface of the substrate to transmit electrical signals to the plurality of sub pixels; a plurality of second pad electrodes which is disposed in the non-active area on a rear surface of the substrate to be electrically connected to an electrical component disposed below the substrate; a plurality of side lines provided at least on a side surface of the substrate to electrically connect the plurality of first pad electrodes and the plurality of second pad electrodes; a side insulating layer which surrounds the plurality of side lines; and an encapsulation layer which surrounds the front surface, the rear surface, and the side surface of the substrate.

The display device may comprise a first edge portion and a second edge portion. The plurality of first pad electrodes, the plurality of second pad electrodes, the plurality of side lines, the side insulating layer and the encapsulation layer may be provided at the first edge portion. The side insulating layer and the encapsulation layer may be provided at the second edge portion without the plurality of first pad electrodes, the plurality of second pad electrodes, and the plurality of side lines being provided at the second edge portion.

The display device may comprise a seal member which surrounds a part of the encapsulation layer at the side surface and the rear surface. The seal member may be provided at the first edge portion and the second edge portion.

The side insulating layer may include a black material.

The substrate may comprise a first substrate and a second substrate which is separate from the first substrate.

Although the example embodiments of the present disclosure have been described in detail with reference to the accompanying drawings, the present disclosure is not limited thereto and may be embodied in many different forms without departing from the technical concept or scope of the present disclosure. Therefore, the example embodiments of the present disclosure are provided for illustrative purposes only but not intended to limit the technical concept or scope of the present disclosure. The scope of the technical concept of the present disclosure is not limited thereto. Therefore, it should be understood that the above-described example embodiments are illustrative in all aspects and do not limit the present disclosure. All the technical concepts in the equivalent scope of the present disclosure should be construed as falling within the scope of the present disclosure. Thus, it is intended that the present disclosure covers the modifications and variations of this disclosure that come within the scope of the claims and their equivalents.

What is claimed is:

1. A display device, comprising:
    a substrate;
    an active area in which a plurality of sub pixels is disposed;
    a non-active area which surrounds the active area;
    a plurality of first pad electrodes which is disposed in the non-active area on a front surface of the substrate to transmit electrical signals to the plurality of sub pixels;
    a plurality of second pad electrodes which is disposed in the non-active area on a rear surface of the substrate to be electrically connected to a printed circuit board;
    a plurality of side lines which is disposed on the front surface, the rear surface, and a side surface of the substrate to electrically connect the plurality of first pad electrodes and the plurality of second pad electrodes;
    a side insulating layer which surrounds the plurality of side lines and includes a black material;
    an encapsulation layer which surrounds the front surface, the rear surface, and the side surface of the substrate;
    a seal member which surrounds a part of the encapsulation layer and adjoins the part of the encapsulation layer;
    a plurality of driving transistors which is disposed on the substrate;
    a plurality of reflection plates which is disposed on the plurality of driving transistors and is connected to the plurality of driving transistors through a contact hole; and
    a plurality of light emitting diodes disposed on the plurality of reflection plates in each of the plurality of sub pixels;
    wherein the plurality of light emitting diodes is connected to the plurality of driving transistors through the plurality of reflection plates.

2. The display device according to claim 1, wherein the encapsulation layer comprises a material including parylene.

3. The display device according to claim 1, wherein the encapsulation layer surrounds an entire front surface and an entire side surface of the substrate.

4. The display device according to claim 1, wherein an opening which exposes the plurality of second pad electrodes on the rear surface of the substrate is disposed in the encapsulation layer.

5. The display device according to claim 4, further comprising:
    a conductive adhesive layer disposed in the opening; and
    a flexible film which electrically connects the plurality of second pad electrodes and the printed circuit board using the conductive adhesive layer.

6. The display device according to claim 1, wherein a thickness of the encapsulation layer which surrounds the front surface of the substrate is equal to or greater than a thickness of the encapsulation layer which surrounds the rear surface of the substrate.

7. The display device according to claim 6, wherein a part of the encapsulation layer which surrounds the rear surface of the substrate has a first thickness, and another part of the encapsulation layer has a second thickness smaller than the first thickness.

8. The display device according to claim 1, further comprising:
    an optical film which is disposed on the front surface of the substrate and the encapsulation layer.

9. The display device according to claim 8, wherein the seal member is disposed so as to surround the encapsulation layer disposed on the side surface of the substrate.

10. The display device according to claim 1, wherein the plurality of side lines includes a material including silver (Ag), and the encapsulation layer is disposed so as to cover the plurality of side lines.

11. The display device according to claim 1, wherein the active area further includes a plurality of gate driving areas which extends from the plurality of sub pixels and includes a gate driver disposed in the plurality of gate driving areas.

12. The display device according to claim 11, wherein active layers of a plurality of transistors disposed in the plurality of sub pixels and active layers of a plurality of transistors disposed in the gate driver comprise oxide semiconductor, amorphous silicon, or polysilicon.

13. The display device according to claim 12, wherein the plurality of transistors disposed in the gate driver includes active layers having different materials.

14. A display device, comprising:
a substrate;
an active area in which a plurality of sub pixels is disposed;
a non-active area which surrounds the active area;
a plurality of first pad electrodes which is disposed in the non-active area on a front surface of the substrate to transmit electrical signals to the plurality of sub pixels;
a plurality of second pad electrodes which is disposed in the non-active area on a rear surface of the substrate to be electrically connected to an electrical component disposed below the substrate;
a plurality of side lines provided at least on a side surface of the substrate to electrically connect the plurality of first pad electrodes and the plurality of second pad electrodes;
a side insulating layer which surrounds the plurality of side lines; and
an encapsulation layer which surrounds the front surface, the rear surface, and the side surface of the substrate;
a seal member which surrounds a part of the encapsulation layer at the side surface and the rear surface and adjoins the part of the encapsulation layer;
a plurality of driving transistors which is disposed on the substrate;
a plurality of reflection plates which is disposed on the plurality of driving transistors and is connected to the plurality of driving transistors through a contact hole; and
a plurality of light emitting diodes disposed on the plurality of reflection plates in each of the plurality of sub pixels;
wherein the plurality of light emitting diodes is connected to the plurality of driving transistors through the plurality of reflection plates.

15. The display device according to claim 14, comprising:
a first edge portion and a second edge portion,
wherein:
the plurality of first pad electrodes, the plurality of second pad electrodes, the plurality of side lines, the side insulating layer and the encapsulation layer are provided at the first edge portion; and
the side insulating layer and the encapsulation layer are provided at the second edge portion without the plurality of first pad electrodes, the plurality of second pad electrodes, and the plurality of side lines being provided at the second edge portion.

16. The display device according to claim 15, wherein the seal member is provided at the first edge portion and the second edge portion.

17. The display device according to claim 14, wherein the side insulating layer includes a black material.

18. The display device according to claim 14, wherein the substrate comprises a first substrate and a second substrate which is separate from the first substrate.

19. The display device according to claim 14, wherein the plurality of light emitting diodes includes a pair of light emitting diodes emitting a same color disposed in each of the plurality of sub pixels.

20. The display device according to claim 14, wherein each of the plurality of light emitting diodes includes a first semiconductor layer, a first electrode on the first semiconductor layer, an emission layer on the first semiconductor, a second semiconductor layer on the emission layer, a second electrode on the second semiconductor layer and an encapsulation film which surrounds the first semiconductor layer, the emission layer, the second semiconductor layer, the first electrode and the second electrode.

* * * * *